United States Patent
Kumamoto et al.

(10) Patent No.: US 7,887,339 B2
(45) Date of Patent: Feb. 15, 2011

(54) CONNECTOR AND CABLE CONNECTOR FOR BALANCED TRANSMISSION

(75) Inventors: Tadashi Kumamoto, Shinagawa (JP); Hideo Miyazawa, Shinagawa (JP); Takeshi Okuyama, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 75 days.

(21) Appl. No.: 12/429,223

(22) Filed: Apr. 24, 2009

(65) Prior Publication Data

US 2009/0277665 A1    Nov. 12, 2009

(30) Foreign Application Priority Data

May 9, 2008    (JP) .............................. 2008-123807

(51) Int. Cl.
*H01R 13/648* (2006.01)
(52) U.S. Cl. .................................................... 439/108
(58) Field of Classification Search .................. 439/98, 439/108, 941, 906, 499, 607.46; 174/261, 174/760; 361/803
See application file for complete search history.

(56) References Cited

U.S. PATENT DOCUMENTS

| | | | |
|---|---|---|---|
| 6,336,827 B1 * | 1/2002 | Akama et al. | 439/607.46 |
| 6,685,511 B2 * | 2/2004 | Akama et al. | 439/607.46 |
| 6,890,189 B1 * | 5/2005 | Wu | 439/76.1 |
| 7,131,862 B2 * | 11/2006 | Vermeersch | 439/497 |
| 2003/0036310 A1 | 2/2003 | Kumamoto | |
| 2006/0046569 A1 | 3/2006 | Kondou et al. | |
| 2007/0072457 A1 * | 3/2007 | Hamazaki | 439/108 |

FOREIGN PATENT DOCUMENTS

| | | | |
|---|---|---|---|
| JP | 2003-059593 A | 2/2003 | |
| JP | 2006-073269 A | 3/2006 | |

\* cited by examiner

*Primary Examiner*—Alexander Gilman
(74) *Attorney, Agent, or Firm*—IPUSA, PLLC

(57) ABSTRACT

A connector for balanced transmission includes a block member having input and output contact pairs formed on front and back surfaces thereof, and a relay wiring substrate having front and back surfaces with a ground layer in between, on which surfaces input contact connecting pads, output contact connecting pads, input wiring patterns, and output wiring patterns are formed. Each input contact pair includes a pair of contact parts formed on the front or back surface of the block member and a pair of lead parts connected to the input contact connecting pads formed on the front or back surface of the relay wiring substrate. Each output contact pair includes a pair of contact parts formed on the front or back surface of the block member and a pair of lead parts connected to the output contact connecting pads formed on the front or back surface of the relay wiring substrate.

9 Claims, 20 Drawing Sheets

CONNECTOR AND CABLE CONNECTOR FOR BALANCED TRANSMISSION

BACKGROUND OF THE INVENTION

1. Field of the Invention

The present invention generally relates to a connector and a cable connector for balanced transmission; for example, a connector and a cable connector for balanced transmission that are configured to prevent crosstalk between input signals (reception signals) and output signals (transmission signals) in a balanced transmission path.

2. Description of the Related Art

As for methods of transmitting data, there is a typical data transmitting method using a single electric wire. Another method is a balanced transmission method using a pair of electric wires. With the balanced transmission method, positive (+) signals are transmitted simultaneously with negative (−) signals having the same size (magnitude) but different polarities as the positive signals. The balanced transmission method has an advantage of being less susceptible to noise compared to the typical data transmitting method and is widely used in fields of transmitting signals at high speed.

A cable connector configuration used for the balanced transmission method includes a cable having four pairs of output electric wires and four pairs of input electric wires and a pair of balanced transmission connectors, one connector connected to each end of the cable (See, for example, Japanese Laid-Open Patent Publication No. 2003-59593).

The balanced transmission connector has a signal transmission path corresponding to a pair of output signal contacts and another signal transmission path corresponding to a pair of input signal contacts that are formed in parallel. At an area where a pair of output signal contacts and a pair of input signal contacts are situated adjacent to each other, crosstalk may occur between the pairs of output electric wires and input electric wires soldered to a relay wiring substrate.

For example, in order to prevent the crosstalk, Japanese Laid-Open Patent Publication No. 2006-73269 proposes to form an output signal path and an input signal path, one of each on either a front surface or a rear surface of a relay wiring substrate.

Next, a balanced transmission cable connector according to a related art example is described.

FIG. 1 is a perspective view of a related art example of a balanced transmission cable connector 300 observed from a diagonally upper side of the balanced transmission cable connector 300. FIG. 2 is a perspective view of the balanced transmission cable connector 300 observed from a diagonally lower side of the balanced transmission cable connector 300. FIG. 3 is a side view of the balanced transmission cable connector 300. FIG. 4 is a vertical cross-sectional view illustrating where the balanced transmission cable connector 300 is connected to an end part of a relay wiring substrate 200.

As illustrated in FIGS. 1 through 4, the balanced transmission cable connector 300 includes the relay wiring substrate 200 and electric wire pairs (pairs of electric wires) 141 through 148. More specifically, the balanced transmission cable connector 300 includes a contact assembly 380, the relay wiring substrate 200, a balanced transmission wiring cable 130, and a shield cover 150. The contact assembly 380 includes output signal contacts 360 that are formed in pairs with input signal contacts 340 and are arranged in a vertical direction (Z1-Z2 direction). Further, the contact assembly 380 includes planar ground contacts 350 arranged alternately with the pairs of contacts 360, 340 at a prescribed pitch in a horizontal direction (X1-X2 direction).

The contact assembly 380 includes eight contact pairs (1)-(8) sequentially arranged on the front and back surfaces of a connecting part 320a of a block member 390 in the horizontal direction (X1-X2 direction). The contact pairs (1)-(8) are grouped into output signal contact pairs (1)-(4) and input signal contact pairs (5)-(8).

The relay wiring substrate 200 is illustrated in FIGS. 5-7. Contact pads (output signal contact connecting pads) 211-218, which are arranged on a front surface 200a of the relay wiring substrate 200 toward the Y2 direction, form contact pairs (1)-(8) with contact pads 231-238 arranged on a back surface 200b of the relay wiring substrate 200. On the other hand, contact pads (output signal wire connecting pads) 221-228, which are arranged on the front surface 200a of the relay wiring substrate 200 toward the Y1 direction, form contact pairs (1)-(4) with corresponding adjacent contact pads 221-228. Further, contact pads 241-248, which are arranged on the back surface 200b of the relay wiring substrate 200 toward the Y1 direction, form contact pairs (5)-(8) with corresponding adjacent contact pads 241-248. The four pairs of wire connecting contact pads (1)-(4) formed on the front surface 200a of the relay wiring substrate 200 correspond to the output signal contact pairs (1)-(4) of the connecting part 320a of the block member 390. The four pairs of wire connecting contact pads (5)-(8) formed on the back surface 200b of the relay wiring substrate 200 correspond to the input signal contact pairs (5)-(8) of the connecting part 320a of the block member 390. By providing vias (e.g., 252, 282, 301) to wiring patterns (e.g., 250, 253, 251, 261), the wiring patterns forming pairs on both the front and back surfaces 200a, 200b of the relay wiring substrate 200 can be changed to wiring patterns forming pairs on a single side (i.e. front surface 200a or the back surface 200b) of the relay wiring substrate 200.

The relay wiring substrate 200 is a multilayer substrate having a substantially square shape. FIG. 7 illustrates two ground layers 201, 202 provided as inside layers in the relay wiring substrate 200. FIG. 5 illustrates the output signal contact connecting pads 211-218 arranged on the front surface 200a along a side of the relay wiring substrate 200 toward the Y2 direction and the output signal wire connecting pads 221-228 arranged on the back surface 200b along another side of the relay wiring substrate 200 toward the Y1 direction. FIG. 6 illustrates input signal contact connecting pads 231-238 arranged on the back surface 200b along the side of the relay wiring substrate 200 toward the Y2 direction and the input signal wire connecting pads 241-248 arranged on the back surface 200b along the other side of the relay wiring substrate 200 toward the Y1 direction.

The balanced transmission cable 130 has eight wire pairs 141-148 coaxially provided in which four wire pairs 141-144 are arranged at an upper side (Z1 direction) in the X1-X2 directions and four wire pairs 145-148 are arranged at a lower side (Z2 direction) in the X1-X2 directions. Each of the wire pairs 141-148 has first and second signal wires 133-1, 133-2 arranged in the X1-X2 directions. The first and second signal wires 133-1, 133-2 arranged on the upper side are signal wires for output signals and the first and second signal wires 133-1, 133-2 arranged on the lower side are signal wires for input signals.

[Connection Configuration of Relay Wiring Substrate 200 Corresponding to Each Contact Pair]

The wire connecting pad pairs (1)-(4) are arranged on the front surface of the relay wiring substrate 200 and the wire connecting pad pairs (5)-(8) are arranged on the back surface of the relay wiring substrate 200. The wire connecting pad pairs (1)-(4) are arranged in order from the X2 direction to the X1 direction. The direction in which the wire connecting pad pairs (1)-(4) are arranged is the same as the direction in which the output signal contact pairs (1)-(4) are arranged. The wire connecting pad pairs (5)-(8) are arranged in order from the X1 direction to the X2 direction. The direction in which the wire connecting pad pairs (5)-(8) are arranged is the opposite direction to the direction in which the output signal contact pairs (5)-(8) are arranged and the direction in which the wire connecting pad pairs (1)-(4) are arranged.

The ground patterns 330, 331 are formed on the front and back surfaces 200a, 200b of the relay wiring substrate 200 in a manner surrounding the pads (e.g., 211, 231) and wiring patterns (e.g., 250, 251) on the front and back surfaces 200a, 200b of the relay wiring substrate 200. The ground patterns 330, 331 are also formed on the front and back surfaces 200a, 200b of the relay wiring substrate 200 at the spaces in between adjacently arranged pads (e.g., 211, 212, 231, 232) and at the spaces in between adjacently arranged wiring patterns (250, 253, 251, 261) on the front and back surfaces 200a, 200b of the relay wiring substrate 200.

The wiring patterns (e.g., 250, 253) of the relay wiring substrate 200 are formed in a manner spreading from the Y2 side of the relay wiring substrate 200 to the Y1 side of the relay wiring substrate 200 in a fan-like (sector) manner without intersecting each other on the same surface. The wiring patterns of the relay wiring substrate 200 include first wiring patterns 500 extending either on the front surface 200a or the back surface 200b and second wiring patterns 600 spanning between the front surface 200a and back surface 200b by way of the vias (e.g., 252, 282).

The wire connecting pads 221, 222 correspond to the wire connecting pad pair (1). The wire connecting pads 223, 224 correspond to the wire connecting pad pair (2). The wire connecting pads 225, 226 correspond to the wire connecting pad pair (3). The wire connecting pads 227, 228 correspond to the wire connecting pad pair (4).

The wire connecting pads 241, 242 correspond to the wire connecting pad pair (5). The wire connecting pads 243, 244 correspond to the wire connecting pad pair (6). The wire connecting pads 245, 246 correspond to the wire connecting pad pair (7). The wire connecting pads 247, 248 correspond to the wire connecting pad pair (8).

[Connection Between Contact Connecting Pads and Corresponding Contact Pairs]

With reference to FIGS. 1-4, a Y2 direction end of the relay wiring substrate 200 is engaged to a Y1 side of the contact assembly 380. The relay wiring substrate 200 is fixed to the contact assembly 380 by soldering the contact connecting pads 211-218 formed on the front surface 200a to first lead parts of the output signal contacts 360, soldering the contact connecting pads 231-238 formed on the back surface 200b to second lead parts of the input signal contacts 340, and soldering a part of the ground patterns 280, 281 to a fork part 35b of the ground contact 350.

[Corresponding Relationship Between Wire Connecting Pads and Contact Pairs]

In this engaged state, the wire connecting pads 221, 222 correspond to the output signal contact pair (1), the wire connecting pads 223, 224 correspond to the output signal contact pair (2), the wire connecting pads 225, 226 correspond to the output signal contact pair (3), the wire connecting pads 227, 228 correspond to the output signal contact pair (4), the wire connecting pads 241, 242 correspond to the input signal contact pair (5), the wire connecting pads 243, 244 correspond to the input signal contact pairs (6), the wire connecting pads 245, 246 correspond to the input signal contact pair (7), and the wire connecting pads 247, 248 correspond to the input signal contact pair (8).

[Connection Between Balanced Transmission Cable 130 and Relay Wiring Substrate 200]

As illustrated in FIG. 1, among the electric wire pairs 141-148 provided on the end of the balanced transmission cable 130, four electric wire pairs 141-144 are arranged at the upper side (toward the front surface 200a) in the X1-X2 directions. The electric wire pair 141 has each of its first and second signal wires 133-1, 133-2 soldered to corresponding wire connecting pads 221, 222 with solders 290, 291. The electric wire pair 142 has each of its first and second signal wires 133-1, 133-2 soldered to corresponding wire connecting pads 223, 224 with solders 290, 291. The electric wire pair 143 has each of its first and second signal wires 133-1, 133-2 soldered to corresponding wire connecting pads 225, 226 with solders 290, 291. The electric wire pair 144 has each of its first and second signal wires 133-1, 133-2 soldered to corresponding wire connecting pads 227, 228 with solders 290, 291.

As illustrated in FIG. 2, the remaining four electric wire pairs 145-148 are arranged at the lower side (toward the back surface 200b) in the X1-X2 directions. The electric wire pair 145 has each of its first and second signal wires 133-1, 133-2 soldered to corresponding to wire connecting pads 241, 242 with solders 290, 291. The electric wire pair 146 has each of its first and second signal wires 133-1, 133-2 soldered to corresponding wire connecting pads 243, 244 with solders 290, 291. The electric wire pair 147 has each of its first and second signal wires 133-1, 133-2 soldered to corresponding wire connecting pads 245, 246 with solders 290, 291. The electric wire pair 148 has each of its first and second signal wires 133-1, 133-2 soldered to corresponding wire connecting pads 247, 248 with solders 290, 291.

[Connection Between Contact Pairs and Relay Wiring Substrate 200]

The output signal contact pair (1) of the contact assembly 380 is electrically connected to the electric wire pair 141 by way of the contact connecting pads 211, 231, wiring patterns 250, 251, a via 252, a wiring pattern 253, and wire connecting pads 221, 222.

The output signal contact pair (2) of the contact assembly 380 is electrically connected to the electric wire pair 142 by way of the contact connecting pads 212, 232, wiring patterns 260, 261, a via 262, a wiring pattern 261, and wire connecting pads 223, 224.

The output signal contact pair (3) of the contact assembly 380 is electrically connected to the electric wire pair 143 by way of the contact connecting pads 213, 233, wiring patterns 270, 271, a via 272, a wiring pattern 271, and wire connecting pads 225, 226.

The output signal contact pair (4) of the contact assembly 380 is electrically connected to the electric wire pair 144 by way of the contact connecting pads 214, 234, wiring patterns 280, 281, a via 282, a wiring pattern 283, and wire connecting pads 227, 228.

The output signal contact pair (5) of the contact assembly 380 is electrically connected to the electric wire pair 145 by way of the contact connecting pads 215, 235, wiring patterns 290, 291, a via 291, a wiring pattern 292, and wire connecting pads 241, 242.

The output signal contact pair (6) of the contact assembly 380 is electrically connected to the electric wire pair 146 by way of the contact connecting pads 216, 217, wiring patterns 300, 301, a via 301, a wiring pattern 303, and wire connecting pads 243, 244.

The output signal contact pair (7) of the contact assembly 380 is electrically connected to the electric wire pair 147 by way of the contact connecting pads 217, 237, a wiring pattern 310, a via 311, wiring pattern 312, 313 and wire connecting pads 245, 246.

The output signal contact pair (8) of the contact assembly 380 is electrically connected to the electric wire pair 148 by way of the contact connecting pads 218, 238, a wiring pattern 320, a via 321, wiring patterns 322, 323 and wire connecting pads 247, 248.

In other words, the electric wire pairs 141-144 correspond to the output signal contact pairs (1)-(4), and the electric wire pairs 145-148 correspond to the input signal pairs (5)-(8).

As illustrated in FIG. 7, the relay wiring substrate 200 has the two ground layers 201, 202 provided between the first and second signal wires 133-1, 133-2 of the output signal electric wire pairs 141-144 and the first and second signal wires 133-1, 133-2 of the input signal electric wire pairs 145-148 for shielding the output and input signal electric wire pairs 141-148. Thereby, generation of crosstalk between input signals and output signals can be prevented.

With the above-described balanced transmission connector 300, the vias 252, 262, 282, 291, 301, 311, 321 are configured to connect the wiring patterns of the front surface 200a and the back surface 200b by penetrating the front and back surfaces of the relay wiring substrate 200. Because the balanced transmission connector 300 has no ground layer for shielding the vias 252, 262, 282, 291, 301, 311, 321, crosstalk may be generated between the vias of the output signals and the vias of the input signals.

SUMMARY OF THE INVENTION

The present invention may provide a connector and a cable connector for balanced transmission that substantially eliminates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a connector and a cable connector for balanced transmission particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a connector for balanced transmission including: a block member having plural input contact pairs and output contact pairs formed on a front surface and a back surface thereof; and a relay wiring substrate having a front surface and a back surface on which plural input contact connecting pads, output contact connecting pads, input wiring patterns, and output wiring patterns are formed, and having a ground layer interposed between the front surface and the back surface thereof; wherein each input contact pair includes a pair of contact parts formed on the front surface or the back surface of the block member, and a pair of lead parts connected to the input contact connecting pads formed on the front or the back surface of the relay wiring substrate, wherein each output contact pair includes a pair of contact parts formed on the front or the back surface of the block member, and a pair of lead parts connected to the output contact connecting pads formed on the front or the back surface of the relay wiring substrate.

Furthermore, another embodiment of the present invention provides a cable connector for balanced transmission including: a balanced transmission cable including plural pairs of electric wires; and first and second connectors connected one to each end of the plural pairs of electric wires; wherein each of the first and second connectors has a block member having plural input contact pairs and output contact pairs formed on a front surface and a back surface thereof, and a relay wiring substrate having a front surface and a back surface on which plural input contact connecting pads, output contact connecting pads, input wiring patterns, and output wiring patterns are formed, and having a ground layer interposed between the front surface and the back surface thereof, wherein each input contact pair includes a pair of contact parts formed on the front or the back surface of the block member, and a pair of lead parts connected to the input contact connecting pads formed on the front or the back surface of the relay wiring substrate, and wherein each output contact pair includes a pair of contact parts formed on the front or the back surface of the block member, and a pair of lead parts connected to the output contact connecting pads formed on the front or the back surface of the relay wiring substrate.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

First Embodiment

Figure 8:
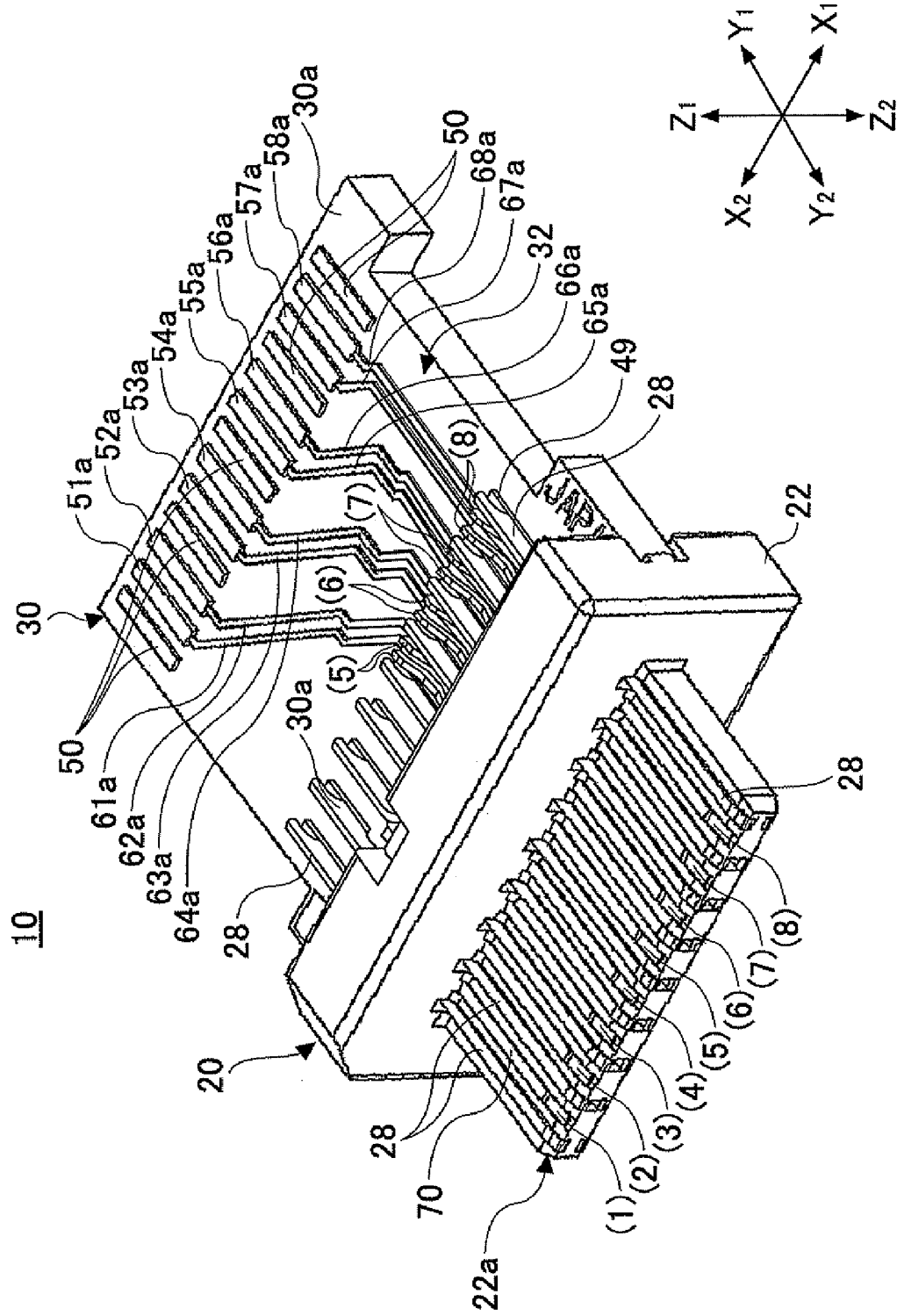
FIG. 8 is a perspective view illustrating a balanced transmission connector observed from a diagonally upper side of the balanced transmission connector according to an embodiment of the present invention.
Figure 9:
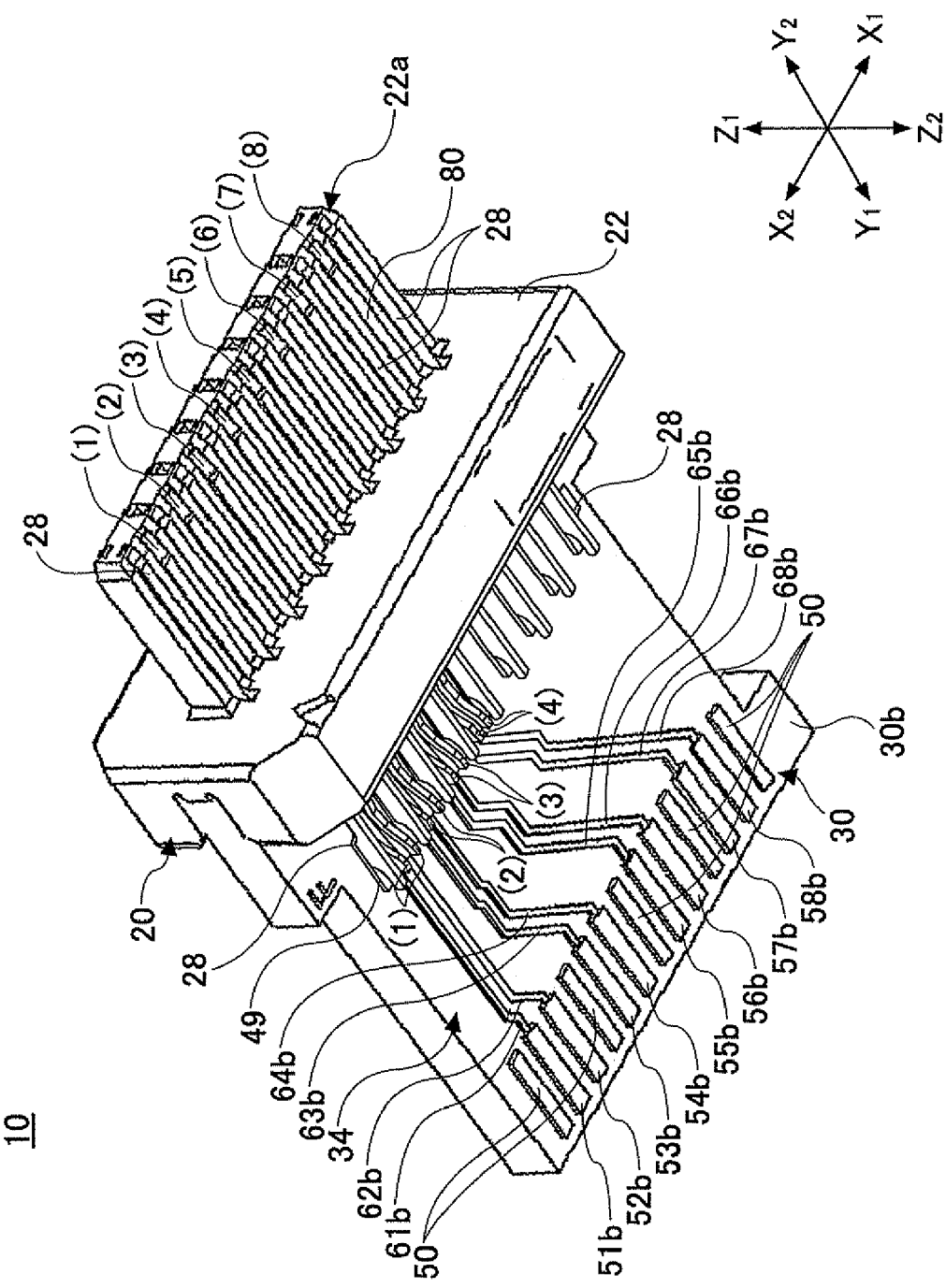
FIG. 9 is a perspective view of a balanced transmission cable connector observed from a diagonally lower side of the balanced transmission connector according to an embodiment of the present invention.

FIG. 8 is a perspective view illustrating a balanced transmission connector 10 observed from a diagonally upper side of the balanced transmission connector 10 according to an embodiment of the present invention. FIG. 9 is a perspective view of the balanced transmission cable connector 10 observed from a diagonally lower side of the balanced transmission connector 10 according to an embodiment of the present invention. The balanced transmission connector 10 of FIGS. 8 and 9 is illustrated having its shield connector detached. Because the configuration of a balanced transmission cable according to this embodiment is substantially the same as that of the above-described balanced transmission cable 130, the same reference numeral is used and further description is omitted.

As illustrated in FIGS. 8 and 9, the balanced transmission connector 10 includes a contact assembly 20 and a relay wiring substrate 30.

Similar to the above-described contact assembly 380, the contact assembly 20 includes output signal contact members 70 that are formed in pairs with input signal contact members 80 and arranged in a vertical direction (Z1-Z2 direction). Further, the contact assembly 20 includes planar ground contacts 50 arranged alternately with the pairs of contacts 70, 80 at a prescribed pitch in a horizontal direction (X1-X2 direction).

The contact assembly 20 includes eight contact pairs (1)-(8) sequentially arranged on the front and back surfaces of a connecting part 22a of a block member 22 in the horizontal direction (X1-X2 direction). The contact pairs (1)-(8) are grouped into output signal contact pairs (1)-(4) and input signal contact pairs (5)-(8).

The relay wiring substrate 30 includes input signal transmitting paths 32 formed on its front surface 30a for transmitting input signals (reception signals) and output signal transmitting paths 34 formed on its back surface 30b for transmitting output signals (transmission signals). Neither the input signal transmitting paths 32 nor the output signal transmitting paths 34 have vias provided for connecting wiring patterns 61a-68a formed on the front surface 30a with wiring patterns 61b-68b formed on the back surface 30b. Because the balanced transmission connector 10 has no vias, crosstalk between input and output signals can be prevented.

Figure 10:
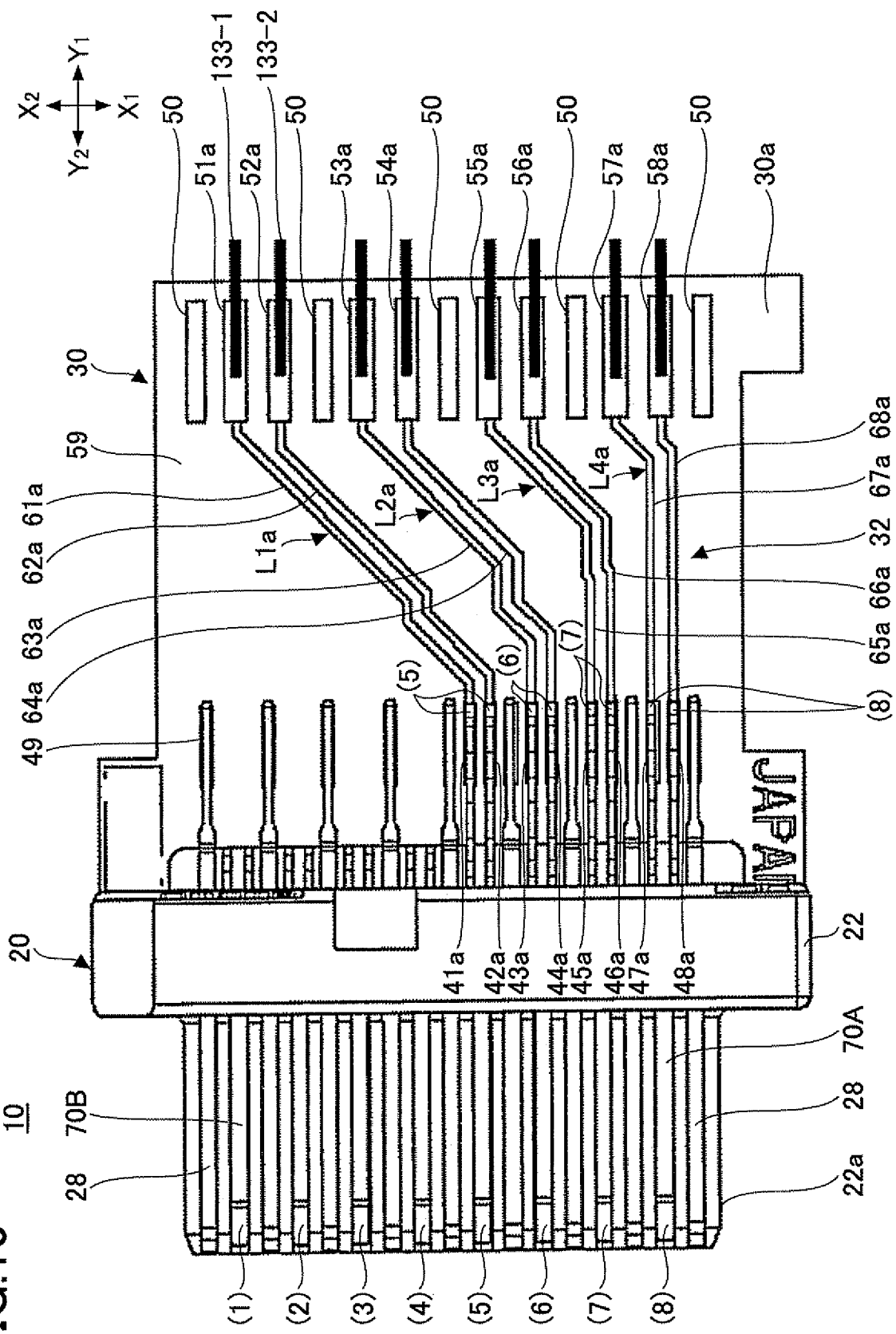
FIG. 10 is a top plan view of a balanced transmission connector according to an embodiment of the present invention.
Figure 11:
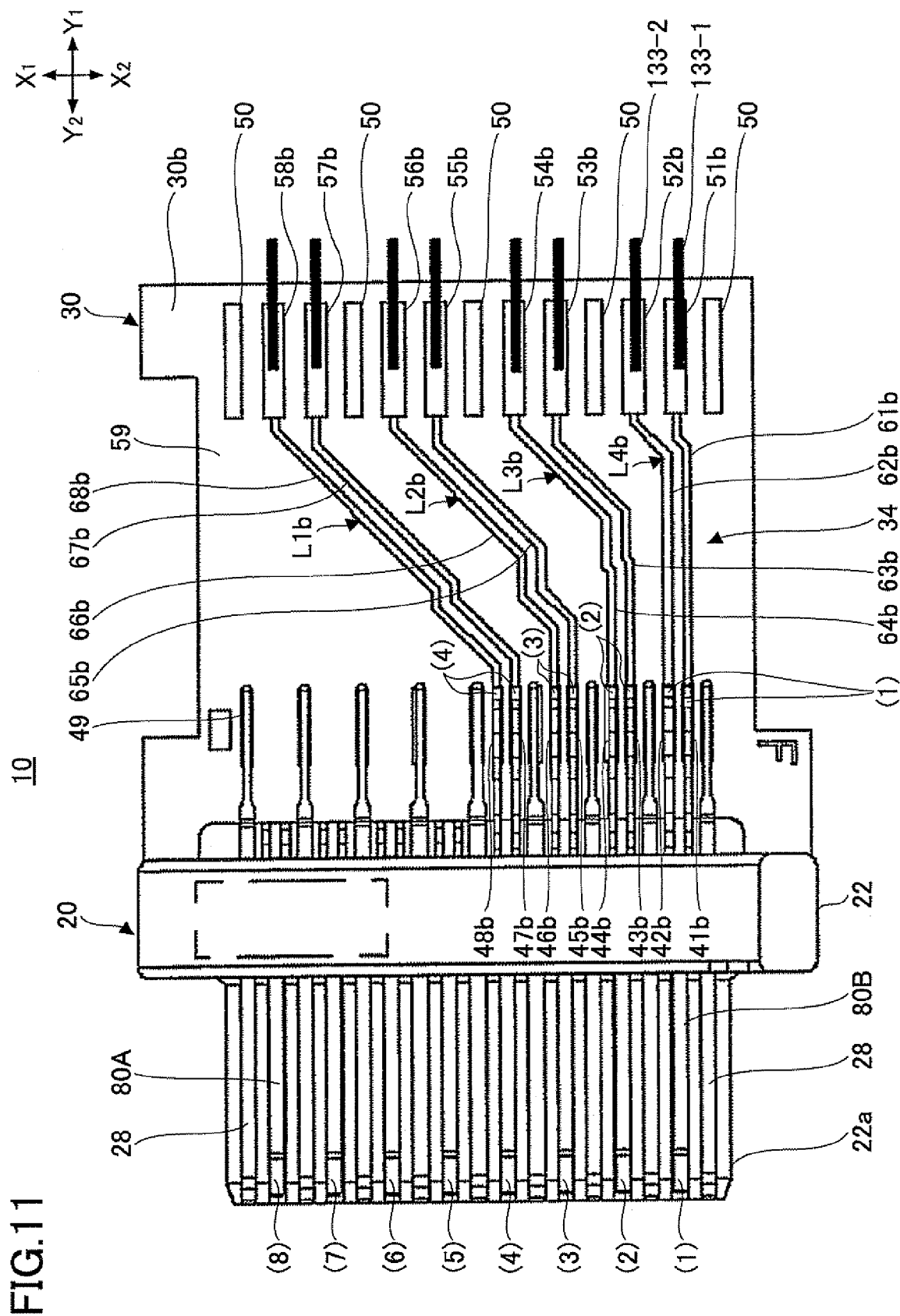
FIG. 11 is a bottom view of a balanced transmission connector according to an embodiment of the present invention.

FIG. 10 is a top plan view of the balanced transmission connector 10 according to an embodiment of the present invention. FIG. 11 is a bottom view of the balanced transmission connector 10 according to an embodiment of the present invention. As illustrated in FIGS. 10 and 11, the input signal transmitting paths 32 formed on the front surface 30a and the output signal transmitting paths 34 formed on the back surface 30b are formed having the same pattern and without their patterns intersecting with each other.

[Configuration of Input Signal Transmitting Paths 34 and the Output Signal Transmitting Paths 32]

As illustrated in FIGS. 8 and 10, the input signal transmitting paths 32 includes input signal contact connecting pads 41a-48a formed on the front surface 30a in the Y2 direction (toward contact side), input signal wire connecting pads 51a-58a formed on the surface 30a in the Y1 direction (toward the cable side), and input signal wiring patterns 61a-68a formed between the input signal contact connecting pads 41a-48a and the input signal wire connecting pads 51a-58a. The wiring patterns 61a-68a electrically connect the input signal contact connecting pads 41a-48a and the input signal wire connecting pads 51a-58a together.

The adjacently arranged pairs of the input signal contact connecting pads 41a-48a correspond to the input signal contact pairs (5)-(8). At the contact side (Y2 direction side) of the front surface 30a of the relay wiring substrate 30, the pairs of the input signal contact connecting pads 41a-48a are partitioned at predetermined intervals by nine ground patterns 49.

Further, the input signal contact connecting pads 41a-48a are formed in a manner extending in the Y1-Y2 directions and arranged substantially in parallel in the X1-X2 directions. In this embodiment, the input signal contact connecting pads 41a-48a are divided into four pairs (i.e. a first pair of connecting pads 41a and 42a, a second pair of connecting pads 43a and 44a, a third pair of connecting pads 45a and 46a, and a fourth pair of connecting pads 47a and 48a) by the ground patterns 49.

Figure 1:
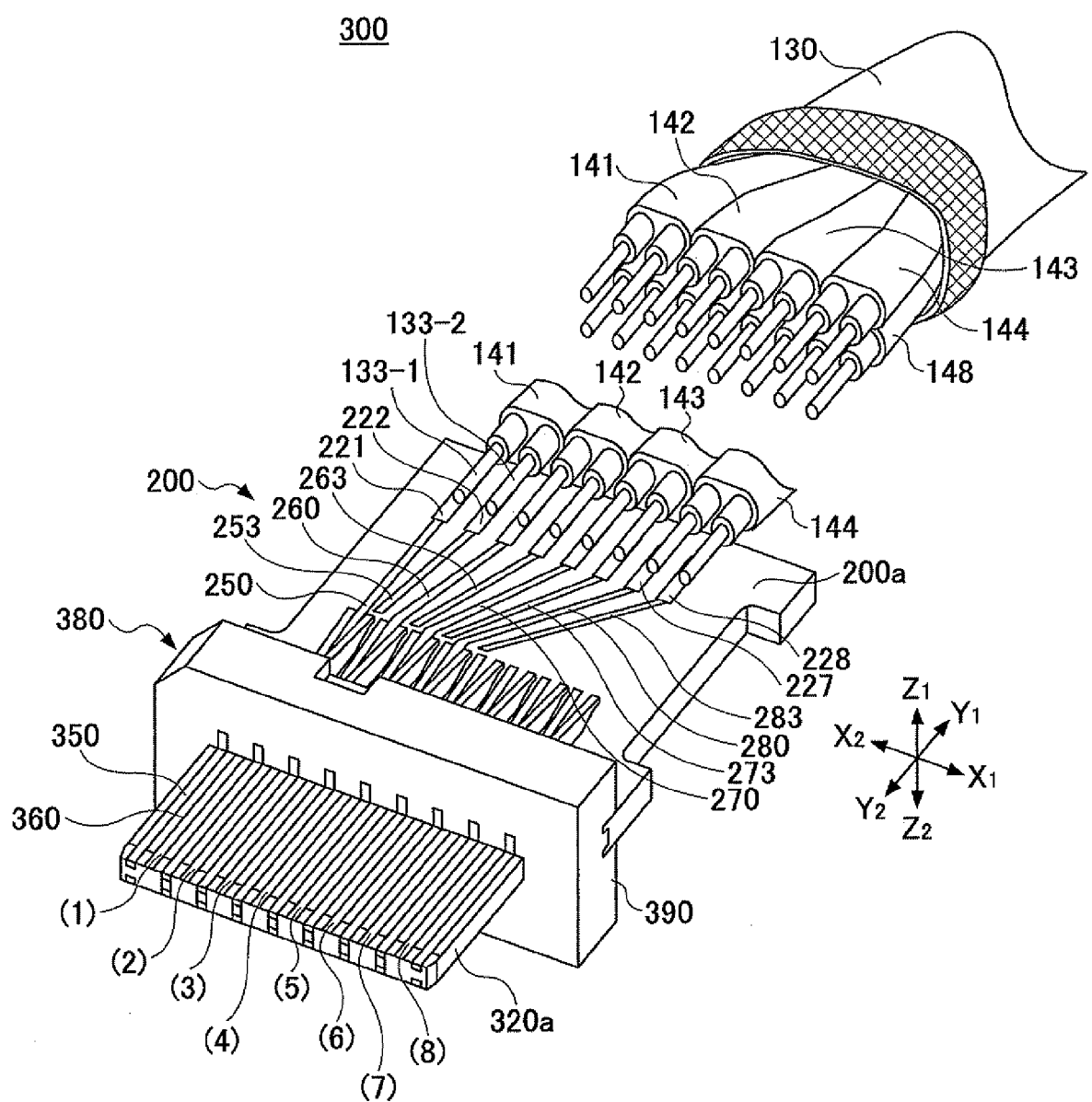
FIG. 1 is a perspective view illustrating a balanced transmission cable connector observed from a diagonally upper side of the balanced transmission cable connector according to a related art example.
Figure 2:
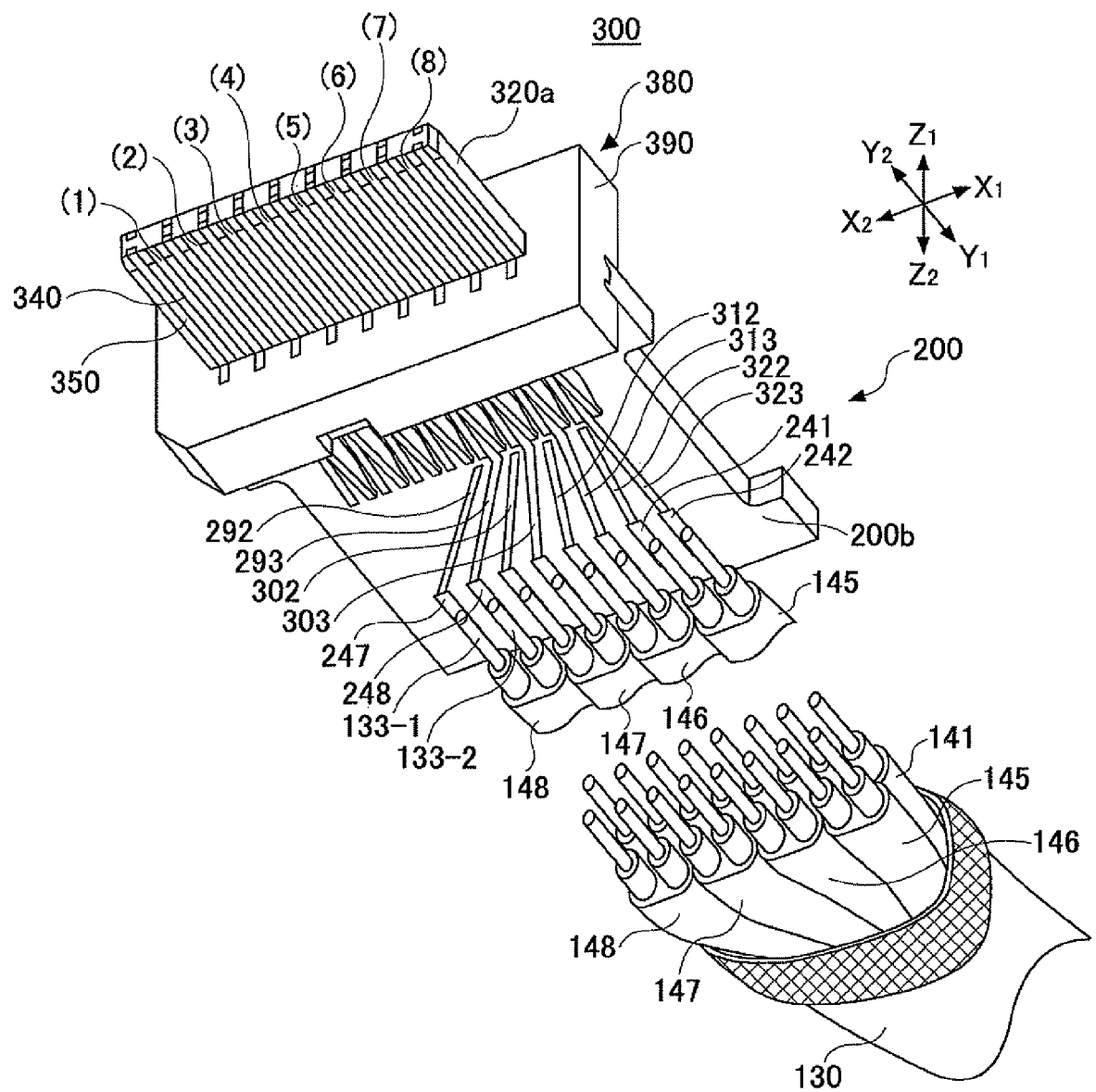
FIG. 2 is a perspective view illustrating a balanced transmission cable connector observed from a diagonally lower side of the balanced transmission cable connector according to a related art example.
Figure 3:
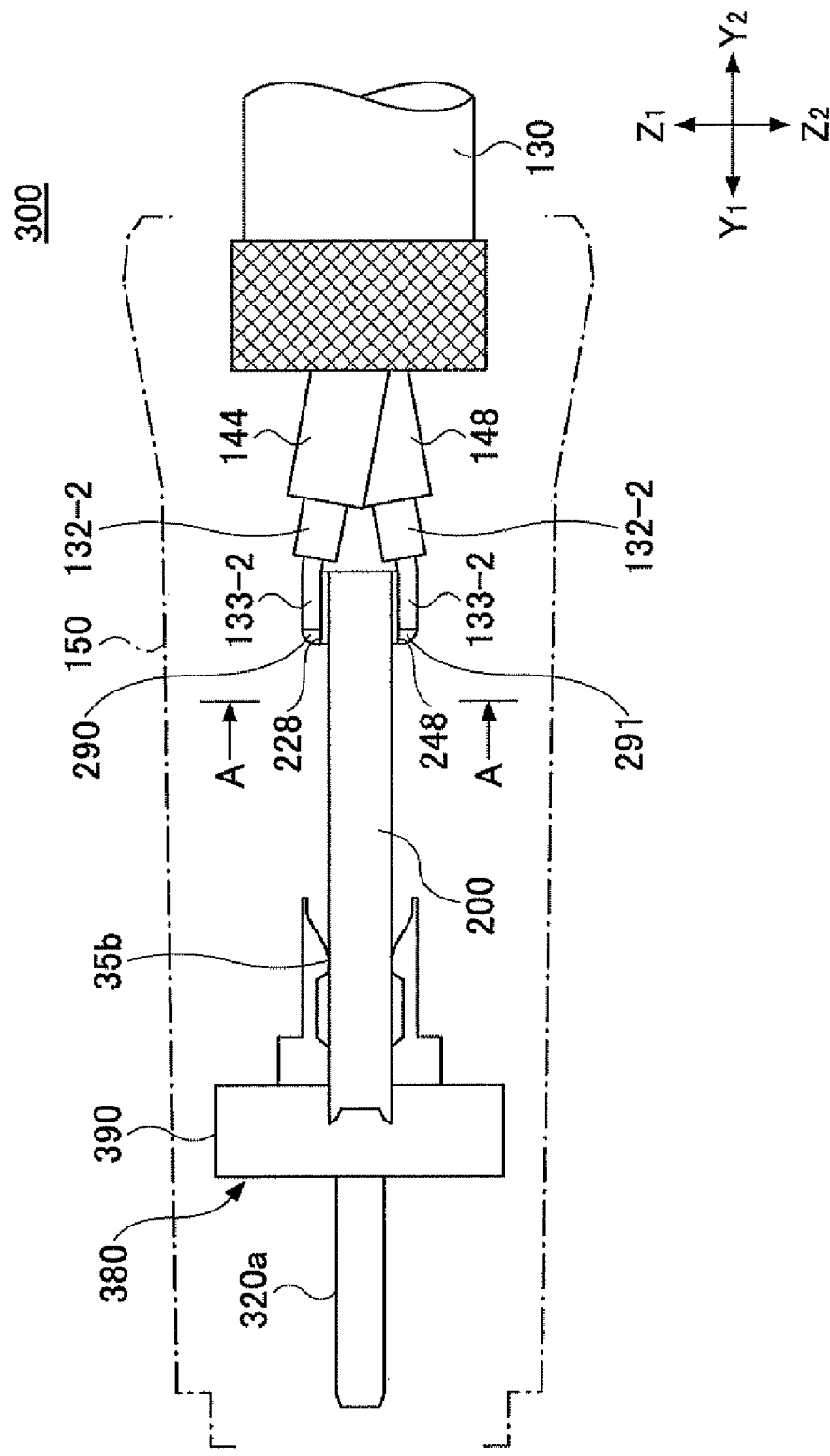
FIG. 3 is a side view illustrating a balanced transmission cable connector according to a related art example.
Figure 4:
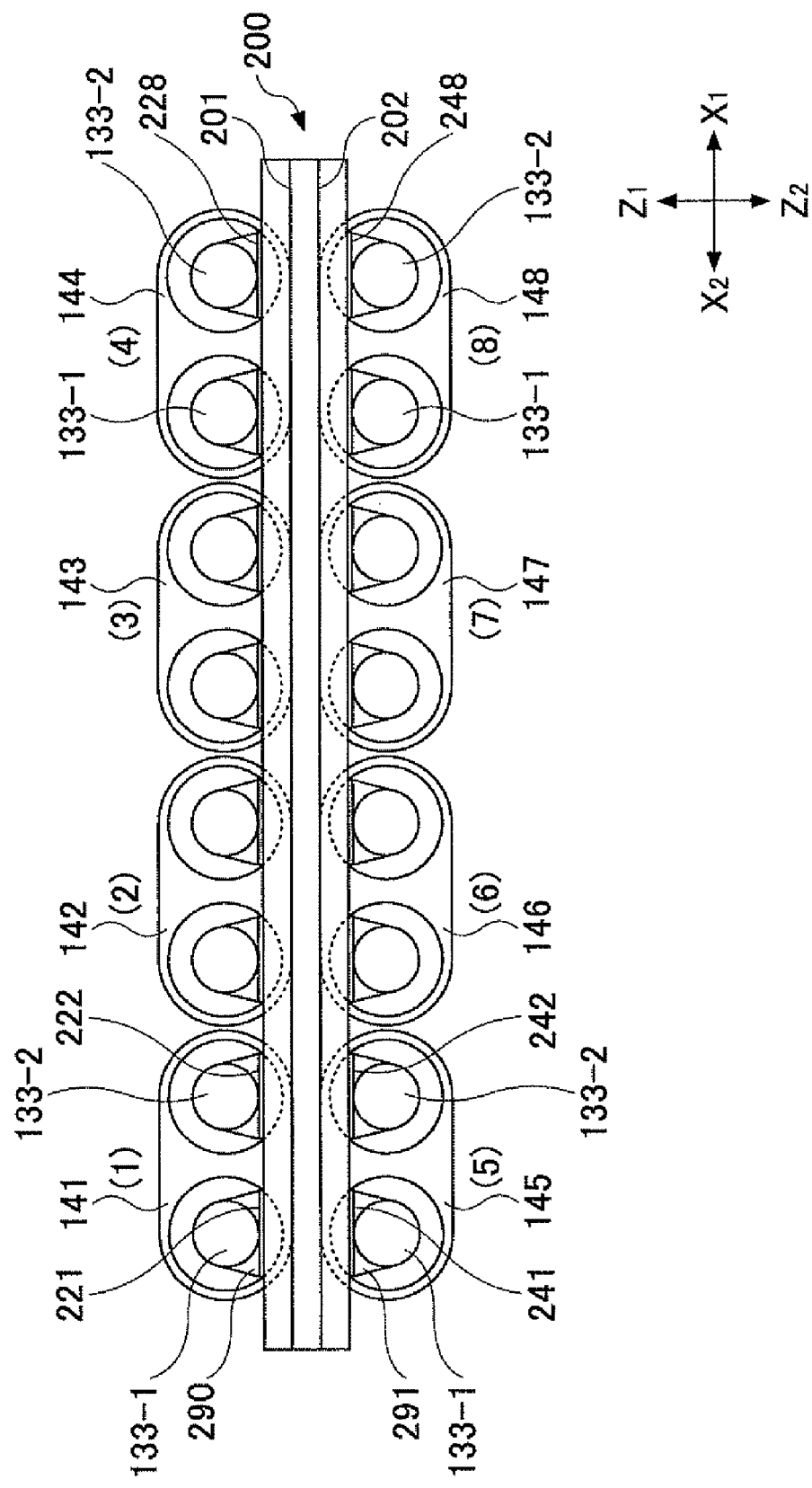
FIG. 4 is a vertical cross-sectional view illustrating a state where a balanced transmission cable connector is connected to an end part of a relay wiring substrate.
Figure 5:
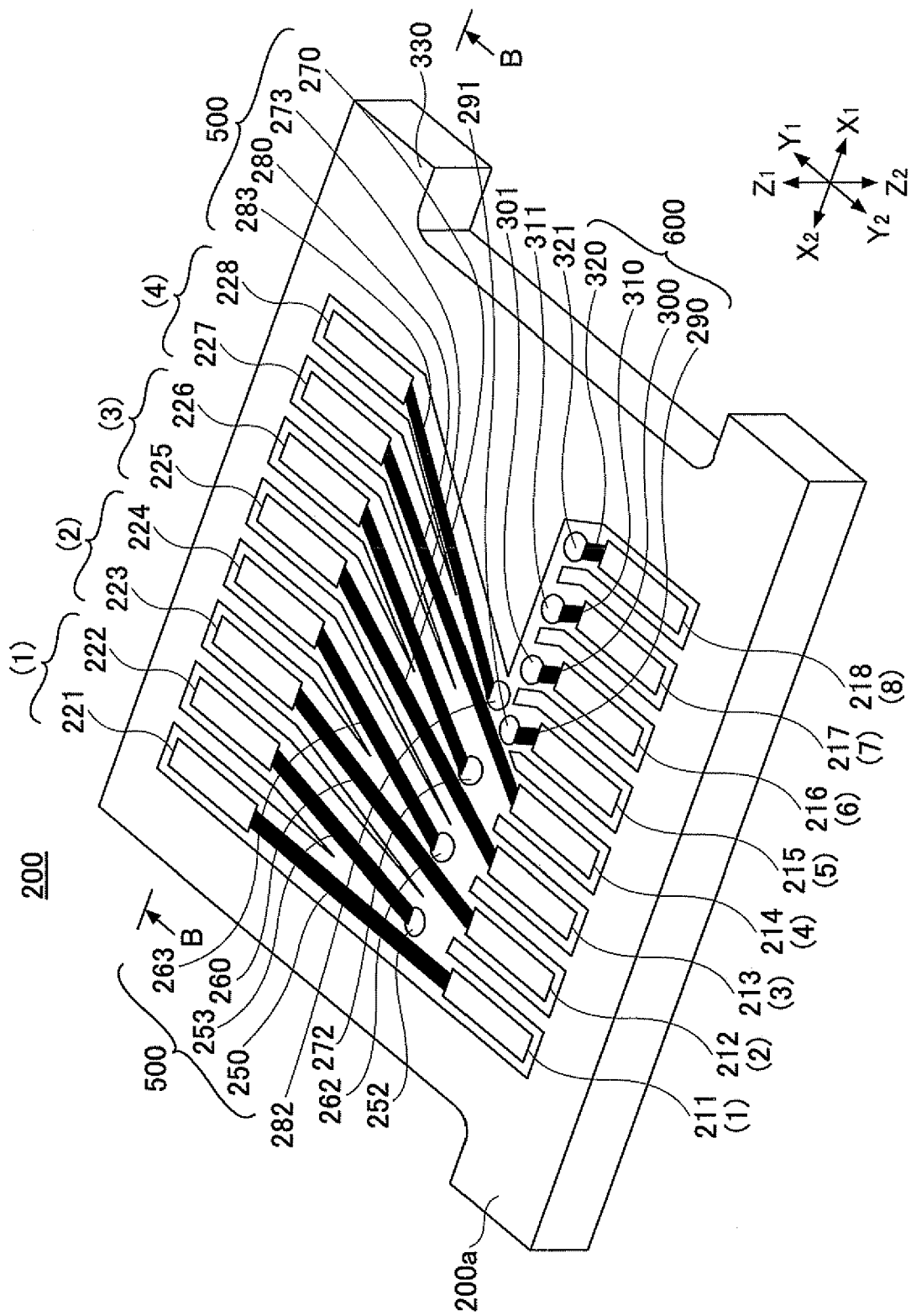
FIG. 5 is a perspective view illustrating a relay wiring substrate observed from a diagonally upper side of the relay wiring substrate according to a related art example.
Figure 6:
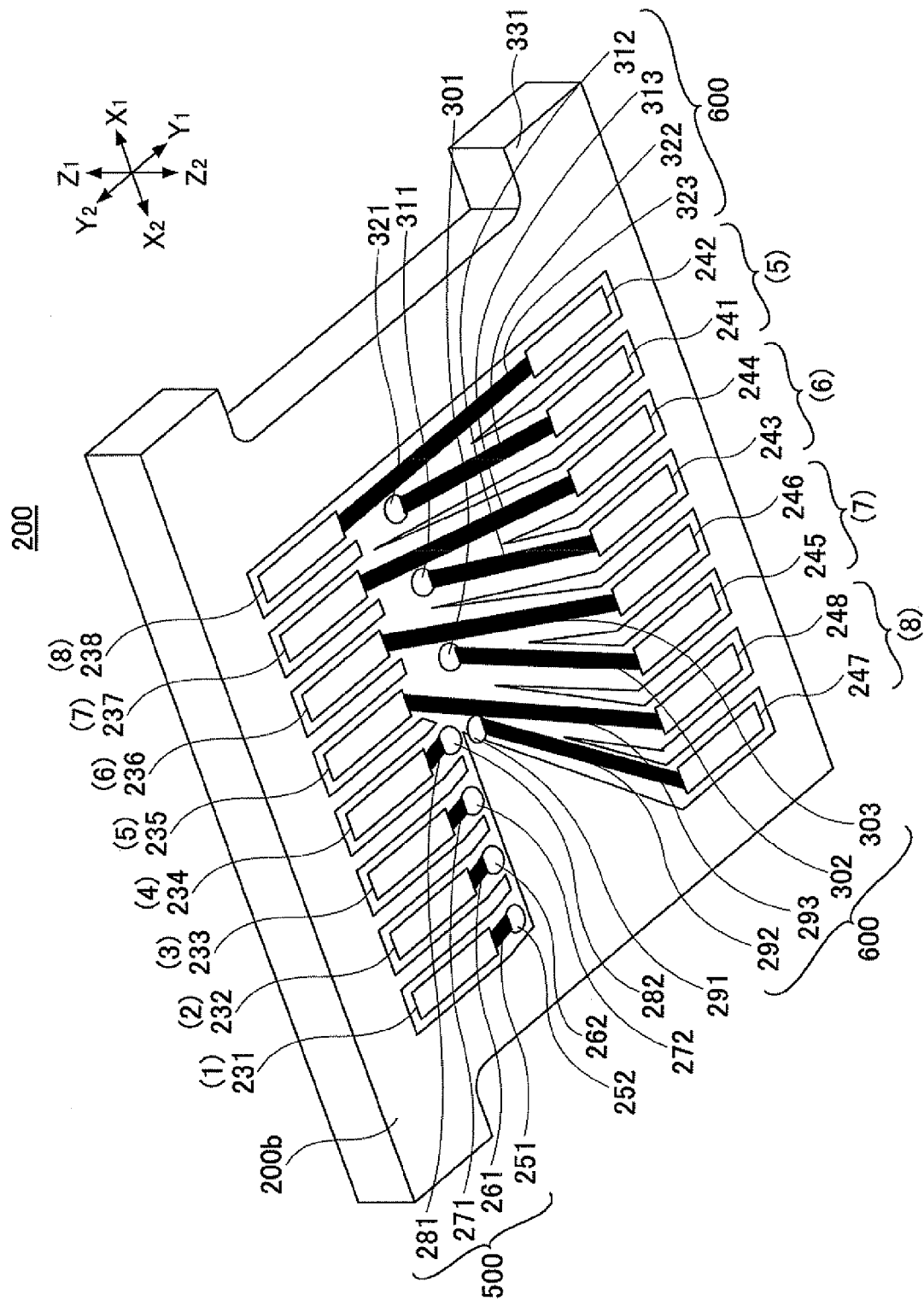
FIG. 6 is a perspective view illustrating a relay wiring substrate observed from a diagonally lower side of the relay wiring substrate according to a related art example.
Figure 7:
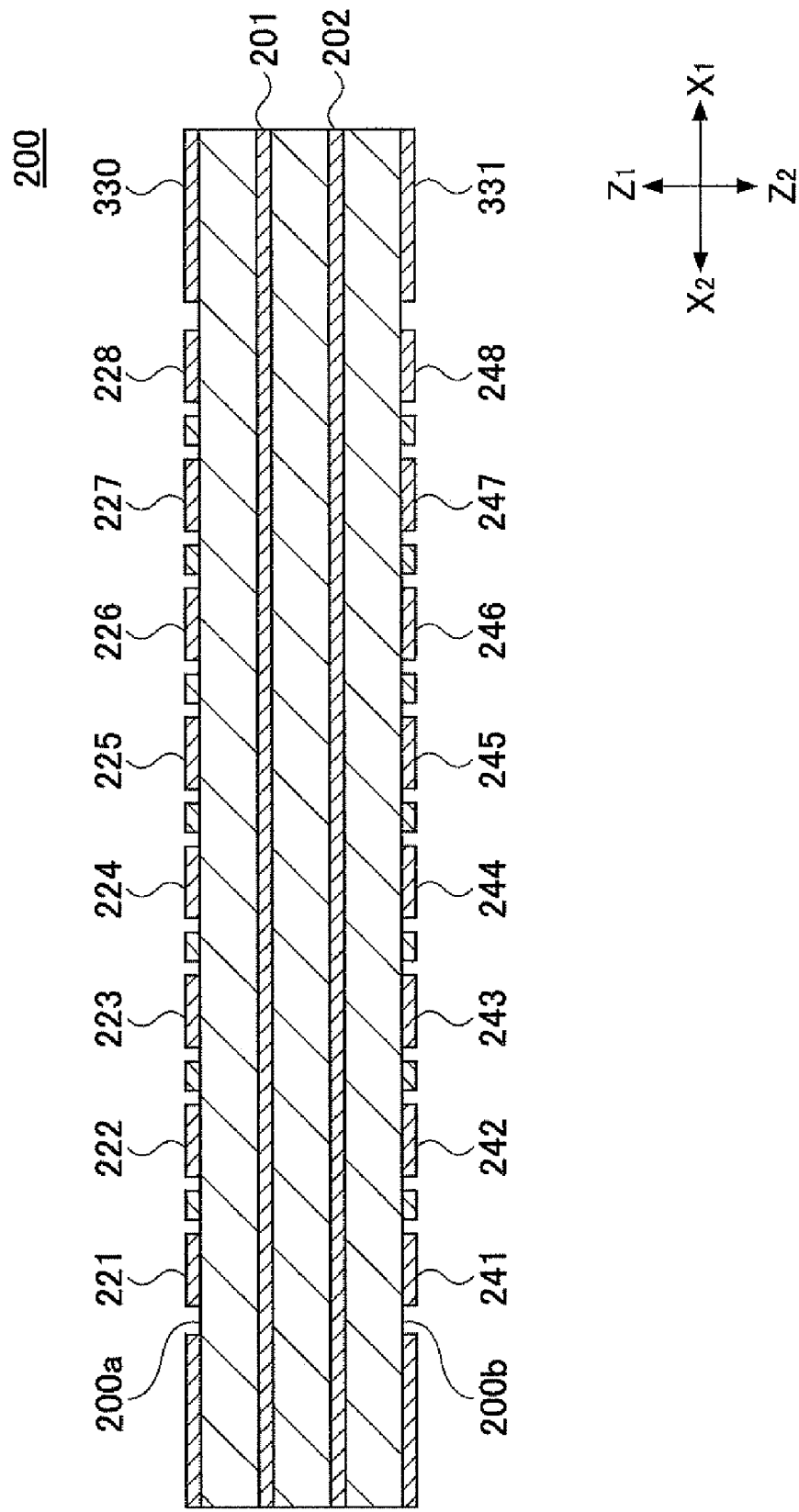
FIG. 7 is a vertical cross-sectional view of the relay wiring substrate taken along line B-B of FIG. 5.

The input signal wire connecting pads 51a-58a correspond to input signal electric wire pairs 145-148 of the balanced transmission cable 130 (see FIG. 4). At the cable side (Y1 direction side) of the front surface 30a of the relay wiring substrate 30, the pairs of the input signal wire connecting pads 51a-58a are partitioned at predetermined intervals by nine ground patterns 50 formed on the front and back surfaces 30a, 30b.

In this embodiment, the wiring patterns 61a-68a are divided into four pairs (i.e. a first pair of wiring patterns 61a and 62a, a second pair of wiring patterns 63a and 64a, a third pair of wiring patterns 65a and 66a, and a fourth pair of wiring patterns 67a and 68a) by a ground pattern 59. In this embodiment, the upper surface of the ground pattern 59 is coated with an insulating layer. The ground patterns 49, 50 are exposed from the insulating layer (i.e. areas that are not coated by the insulating layer).

The input signal contact connecting pads 41a-48a are densely arranged in a manner covering substantially half the space of the relay wiring substrate 30 in the width direction (X1-X2 direction) whereas the input signal wire connecting pads 51a-58a are sparsely arranged in a manner covering substantially the entire space of the relay wiring substrate 30 in the width direction (X1-X2 direction). Therefore, the corresponding relationship between the input signal contact connecting pads 41a-48a and the input signal wire connecting pads 51a-58a is deviated in the X1-X2 direction.

Therefore, the pairs of the input signal wiring patterns 61a-68a are formed substantially in parallel and with different lengths. For example, in a case supposing that the entire length of the pair of wiring patterns 61a, 62a is L1a, the entire length of the pair of wiring patterns 63a, 64a is L2a, the entire length of the pair of wiring patterns 65a, 66a is L3a, and the entire length of the pair of wiring patterns 67a, 68a is L4a, the lengths become longer (the wiring patterns diagonally extend further) as the deviation in the X1-X2 direction becomes greater such that a relationship of L1a>L2a>L3a>L4a is satisfied.

The input signal wiring patterns 61a-68a are formed so that the entire lengths of each of the pairs satisfy a relationship of L1a+L4a=L2a+L3a.

As illustrated in FIGS. 9 and 11, although the output signal transmitting paths 34 basically have the same pattern as the input signal transmitting paths 32 when the viewing each corresponding surface in its plan view, the output signal transmitting paths 34 are formed oriented in an opposite direction with respect to the X1-X2 directions when both surfaces are viewed from the plan view of the front surface 30a or the back surface 30b. The output signal transmitting paths 34 includes output signal contact connecting pads 41b-48b formed on the back surface 30b in the Y2 direction (toward contact side), output signal wire connecting pads 51b-58b formed on the back surface 30b in the Y1 direction (toward the cable side), and output signal wiring patterns 61b-68b formed between the output signal contact connecting pads 41b-48b and the output signal wire connecting pads 51b-58b. The wiring patterns 61b-68b electrically connect the output signal contact connecting pads 41b-48b and the input signal wire connecting pads 51a-58a together.

The adjacently arranged pairs of the output signal contact connecting pads 41b-48b correspond to the input signal contact pairs (1)-(4). At the contact side (Y2 direction side) of the back surface 30b of the relay wiring substrate 30, the pairs of the output signal contact connecting pads 41b-48b are partitioned at predetermined intervals by nine ground patterns 49.

Further, the output signal contact connecting pads 41b-48b are formed in a manner extending in the Y1-Y2 directions and arranged substantially in parallel in the X1-X2 directions. In this embodiment, the output signal contact connecting pads 41b-48b are divided into four pairs (i.e. a first pair of connecting pads 41b and 42b, a second pair of connecting pads 43b and 44b, a third pair of connecting pads 45b and 46b, and a fourth pair of connecting pads 47b and 48b) by the ground patterns 49.

The output signal wire connecting pads 51b-58b correspond to output signal electric wire pairs 141-144 of the balanced transmission cable 130 (see FIG. 4). At the cable side (Y1 direction side) of the back surface 30b of the relay wiring substrate 30, the pairs of the output signal wire connecting pads 51b-58b are partitioned at predetermined intervals by nine ground patterns 50 formed on the front and back surfaces 30a, 30b.

In this embodiment, the wiring patterns 61b-68b are divided into four pairs (i.e. a first pair of wiring patterns 61b and 62b, a second pair of wiring patterns 63b and 64b, a third pair of wiring patterns 65b and 66b, and a fourth pair of wiring patterns 67b and 68b) by the ground pattern 59. In this embodiment, the upper surface of the ground pattern 59 is coated with an insulating layer. The ground patterns 49, 50 are exposed from the insulating layer.

The output signal contact connecting pads 41b-48b are densely arranged in a manner covering substantially half the space of the relay wiring substrate 30 in the width direction (X1-X2 direction) whereas the output signal wire connecting pads 51b-58b are sparsely arranged in a manner covering substantially the entire space of the relay wiring substrate 30 in the width direction (X1-X2 direction). Therefore, the corresponding relationship between the output signal contact connecting pads 41b-48b and the output signal wire connecting pads 51b-58b is deviated in the X1-X2 direction.

Therefore, the pairs of the output signal wiring patterns 61b-68b are formed substantially in parallel and with different lengths. For example, in a case supposing that the entire length of the pair of wiring patterns 61b, 62b is L4b, the entire length of the pair of wiring patterns 63b, 64b is L3b, the entire length of the pair of wiring patterns 65b, 66b is L2b, and the entire length of the pair of wiring patterns 67b, 68b is L1b, the lengths become longer (the wiring patterns diagonally extend further) as the deviation in the X1-X2 direction becomes greater such that a relationship of L1b>L2b>L3b>L4b is satisfied.

The output signal wiring patterns 61b-68b are formed so that the entire lengths of each of the pairs satisfies a relationship of L1b+L4b=L2b+L3b.

[Configurations of Output Signal Contact Pairs (1)-(4) and Input Signal Contact Pairs (5)-(8)]

Figure 12A:
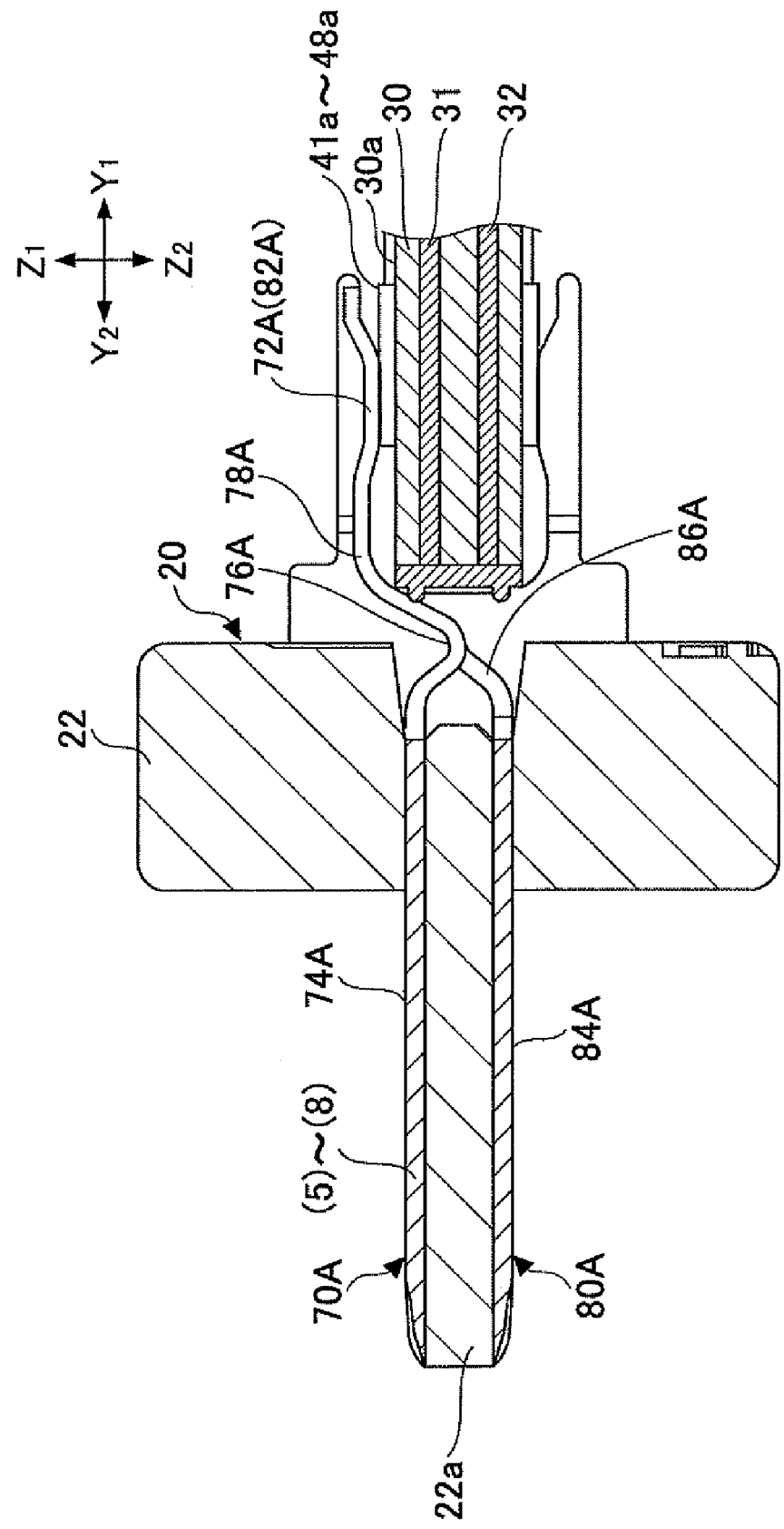
FIG. 12A is a vertical cross-sectional view illustrating a configuration of input signal contact pairs (5)-(8) according to an embodiment of the present invention.
Figure 12B:
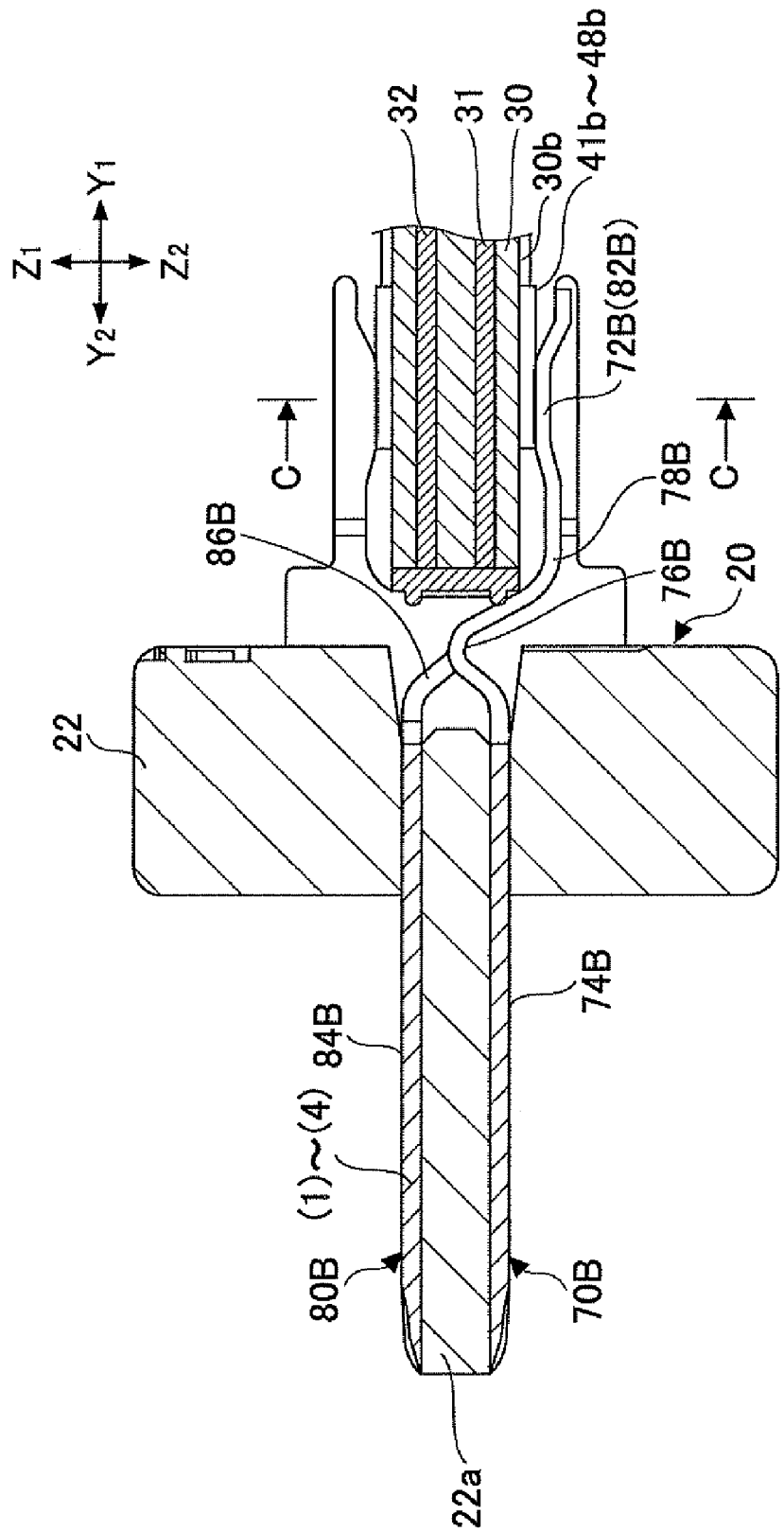
FIG. 12B is a vertical cross-sectional view illustrating a configuration of output signal contact pairs (1)-(4) according to an embodiment of the present invention.

FIG. 12A is a vertical cross-sectional view illustrating a configuration of the input signal contact pairs (5)-(8) according to an embodiment of the present invention. FIG. 12B is a vertical cross-sectional view illustrating a configuration of the output signal contact pairs (1)-(4) according to an embodiment of the present invention.

As illustrated in FIG. 12A, each of the input signal contact pairs (5)-(8) includes a first contact member 70A provided on a front surface side (upper side) of the connecting part 22a and a second contact member 80A provided on a back surface side (lower side) of the connecting part 22a. The first and second contact members 70A, 80A have lead parts 72A, 82A, respectively. Both the lead parts 72A, 82A are connected to input signal contact connecting pads 41a-48a provided on the front surface 30a by soldering.

As illustrated in FIG. 12B, each of the output signal contact pairs (1)-(4) includes a third contact member 70B provided on a back surface side (lower side) of the connecting part 22a and a fourth contact member 80B provided on a front surface side (upper side) of the connecting part 22a. The third and fourth contact members 70B, 80B have lead parts 72B, 82B, respectively. Both the lead parts 72B, 82B are connected to output signal contact connecting pads 41b-48b provided on the back surface 30b by soldering.

Figure 13:
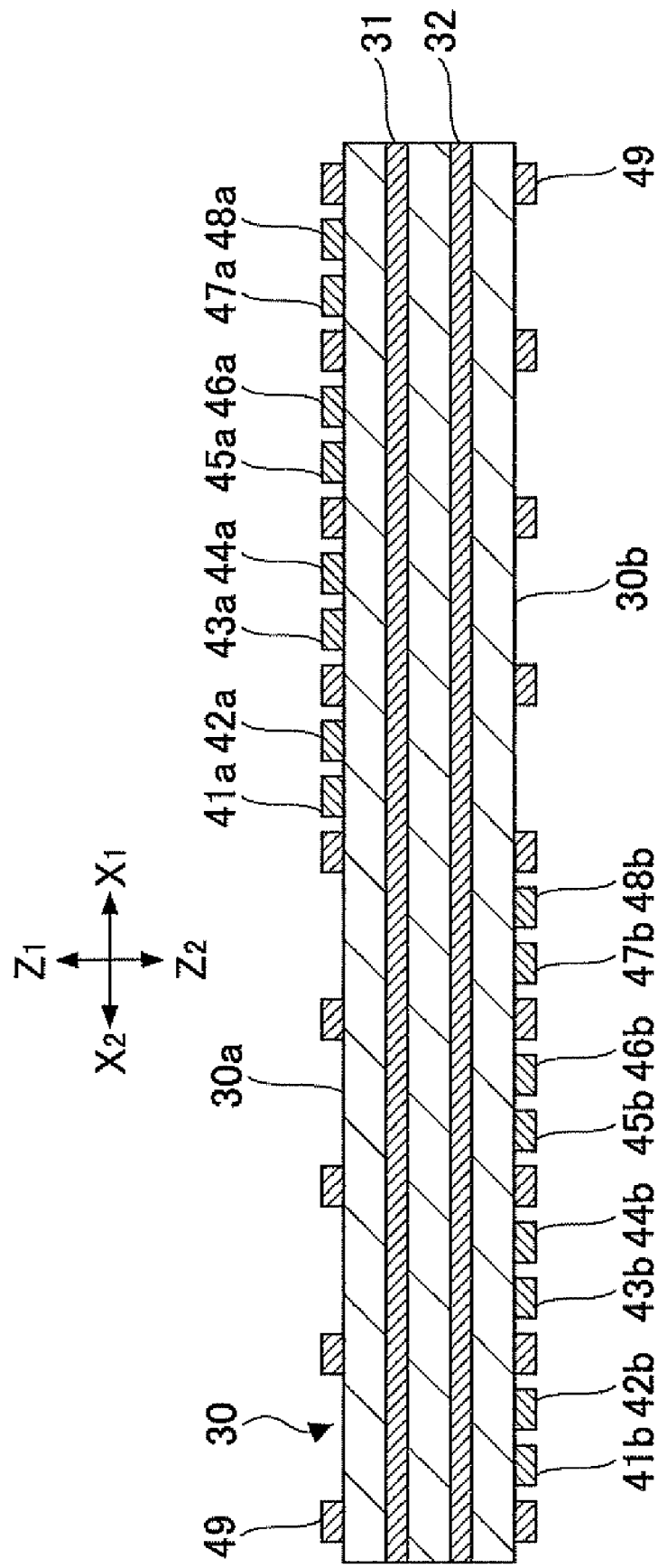
FIG. 13 is a vertical cross-sectional view of a relay wiring substrate according to an embodiment of the present invention.

FIG. 13 is a vertical cross-sectional view of the relay wiring substrate 30 according to an embodiment of the present invention. As illustrated in FIG. 13, the relay wiring substrate 30 includes ground layers 31, 32 provided between the front surface 30a and the back surface 30b at a predetermined interval(s) in the vertical direction (Z1-Z2 directions). The ground layers 31, 32 are formed substantially parallel to each other on the front and back surfaces 30a, 30b, respectively. In addition, the ground layers 31, 32 are formed in layers without vias penetrating in the vertical direction (Z1-Z2 directions). Therefore, the relay wiring substrate 30 is shielded by the ground layers 31, 32 provided between the front surface 30a and the back surface 30b. This configuration ensures prevention of crosstalk generated between the input signal contact connecting pads 41a-48a provided on the front surface 30a and the output signal contact connecting pads 41b-48b provided on the back surface 30b.

Further, the input signal contact connecting pads 41a-48a are arranged close to each other, together covering substantially half the area of the front surface 30a in the X1 direction. On the other hand, the output signal contact connecting pads 41b-48b are arranged close to each other covering substantially half the area of the back surface 30b in the X2 direction. Therefore, the input signal contact connecting pads 41a-48a can be prevented from overlapping with the output signal contact connecting pads 41b-48b in the vertical direction. Further, the transmission paths of input signals 32 can be positioned away from the transmission paths of output signals 34.

[Configurations of First Contact Member 70A and Second Contact Member 80A]

Figure 14A:
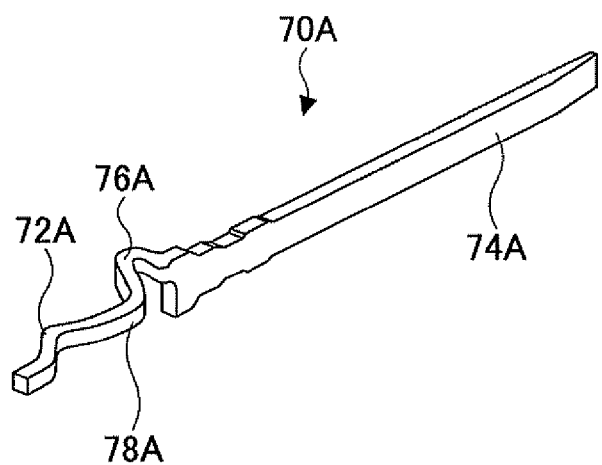
FIG. 14A is a perspective view illustrating a first contact member according to an embodiment of the present invention.
Figure 14B:
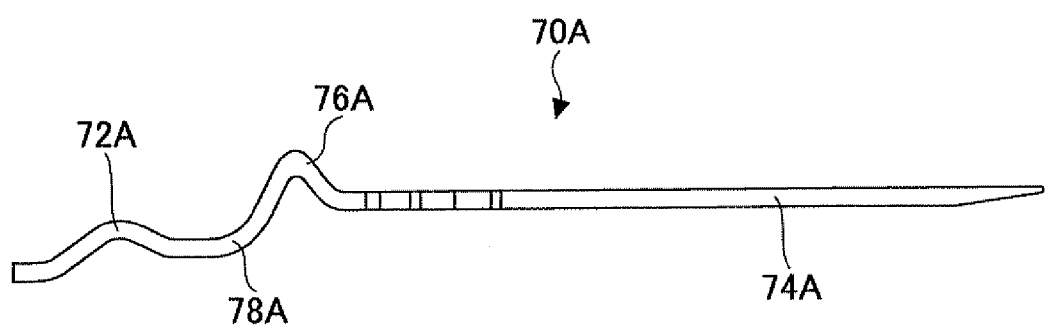
FIG. 14B is a side view illustrating a first contact member according to an embodiment of the present invention.
Figure 14B:
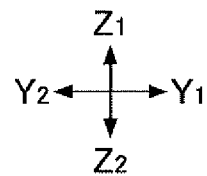
Figure 14C:
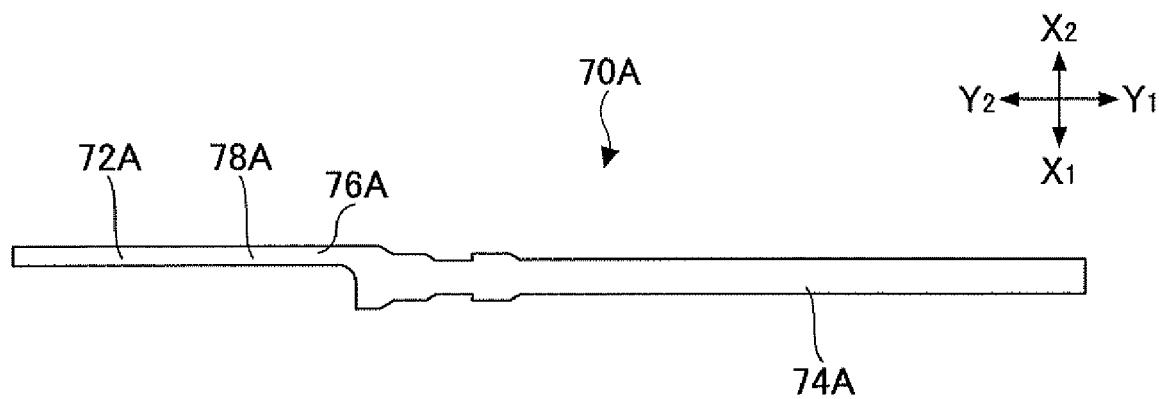
FIG. 14C is a plan view illustrating a first contact member according to an embodiment of the present invention.

FIG. 14A is a perspective view illustrating the first contact member 70A according to an embodiment of the present invention. FIG. 14B is a side view illustrating the first contact member 70A according to an embodiment of the present invention. FIG. 14C is a plan view illustrating the first contact member 70A according to an embodiment of the present invention.

As illustrated in FIGS. 14A-14C, the first contact member 70A includes the lead part 72A which is to contact and be soldered to the input signal contact connecting pads 41a, 43a, 45a, and 47a. The first contact member 70A also includes a contact part 74A to be inserted into a groove of the connecting part 22a of the contact assembly 20. The lead part 72A is offset with respect to the contact part 74a in the X2 direction. The amount in which the lead part 72A is offset is determined according to a relative position with respect to the input signal contact connecting pads 41a, 43a, 45a, and 47a.

Further, the first contact member 70A also includes first and second bent parts 76A, 78A for coupling the lead part 72A and the contact part 74A together.

The first bent part 76A is bent more toward the Z2 direction with respect to the contact part 74A and bent in a V-like shape in the Z2 direction. The second bent part 78a is bent in the opposite direction to the first bent part 76A. The second bent part 78a has a curvature radius greater than that of the first bent part 76A. Furthers the second bent part 78a is bent in the Y2 direction having a moderate curve.

Figure 15A:
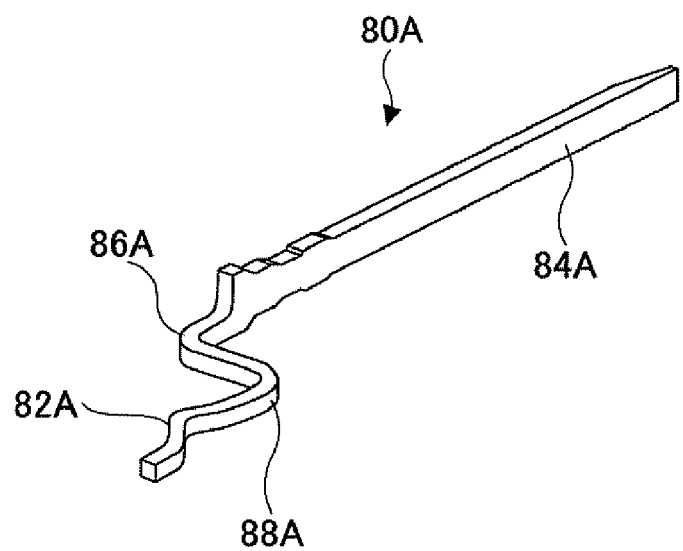
FIG. 15A is a perspective view illustrating a second contact member according to an embodiment of the present invention.
Figure 15B:
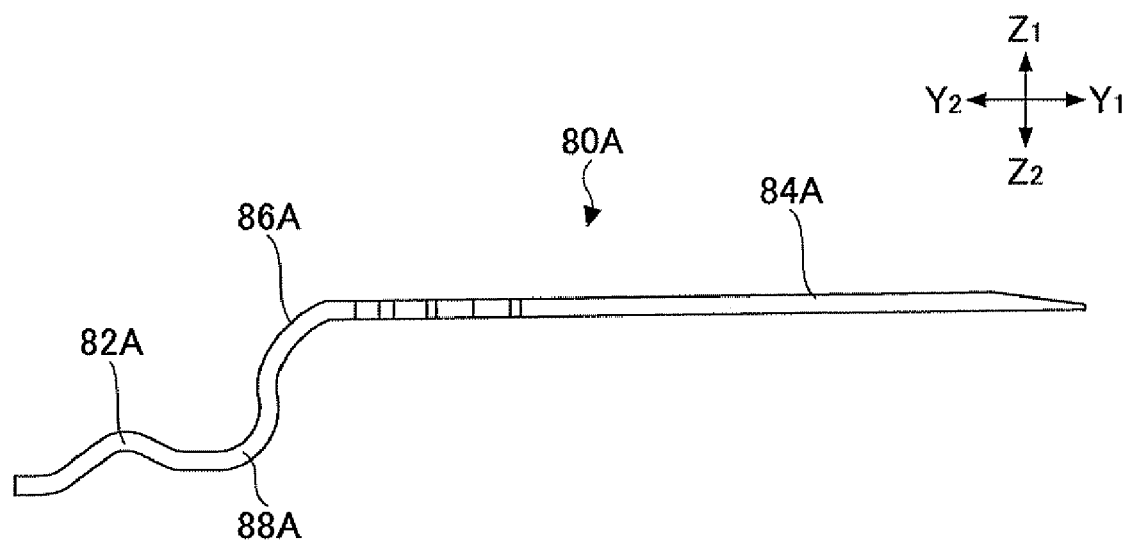
FIG. 15B is a side view illustrating a second contact member according to an embodiment of the present invention.
Figure 15C:
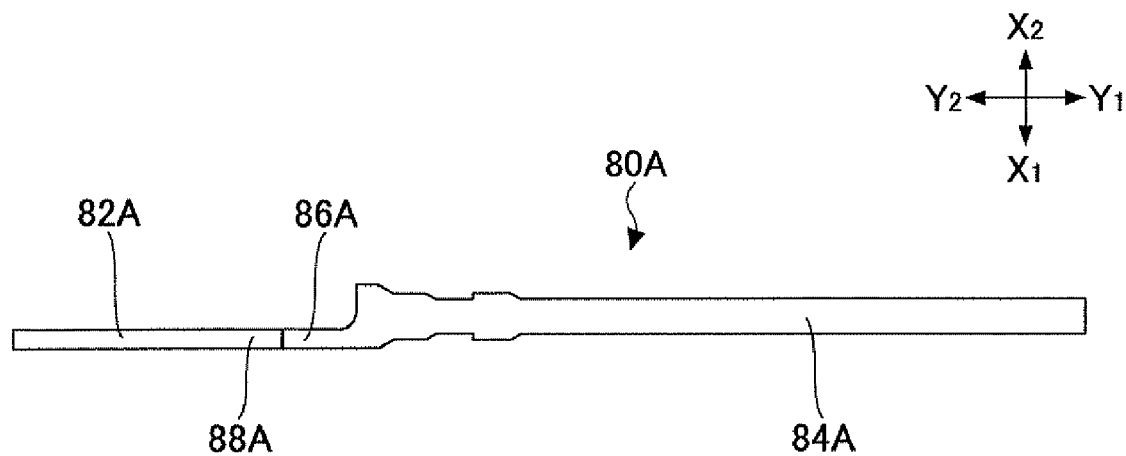
FIG. 15C is a plan view illustrating a second contact member according to an embodiment of the present invention.

FIG. 15A is a perspective view illustrating the second contact member 80A according to an embodiment of the present invention. FIG. 15B is a side view illustrating the second contact member according to an embodiment of the present invention. FIG. 15C is a plan view illustrating the second contact member 80A according to an embodiment of the present invention.

As illustrated in FIGS. 15A-15C, the second contact member 80A includes the lead part 82A which is to contact and be soldered to the input signal contact connecting pads 42a, 44a, 46a, and 48a. The second contact member 80A also includes a contact part 84A to be inserted into a groove of the connecting part 22a of the contact assembly 20. The lead part 82A is offset with respect to the contact part 84a in the X1 direction. The amount in which the lead part 82A is offset is determined according to a relative position with respect to the input signal contact connecting pads 42a, 44a, 46a, and 48a.

Further, the second contact member 80A also includes first and second bent parts 86A, 88A for coupling the lead part 82A and the contact part 84A together.

The first bent part 86A is bent substantially at a right angle in the Z2 direction. The second bent part 88A is bent in an opposite direction as the first bent part 86A. The second bent part 88A has a curvature radius greater than that of the first bent part 86A. Further, the second bent part 88a is bent at a substantially right angle in the Y2 direction.

Figure 16A:
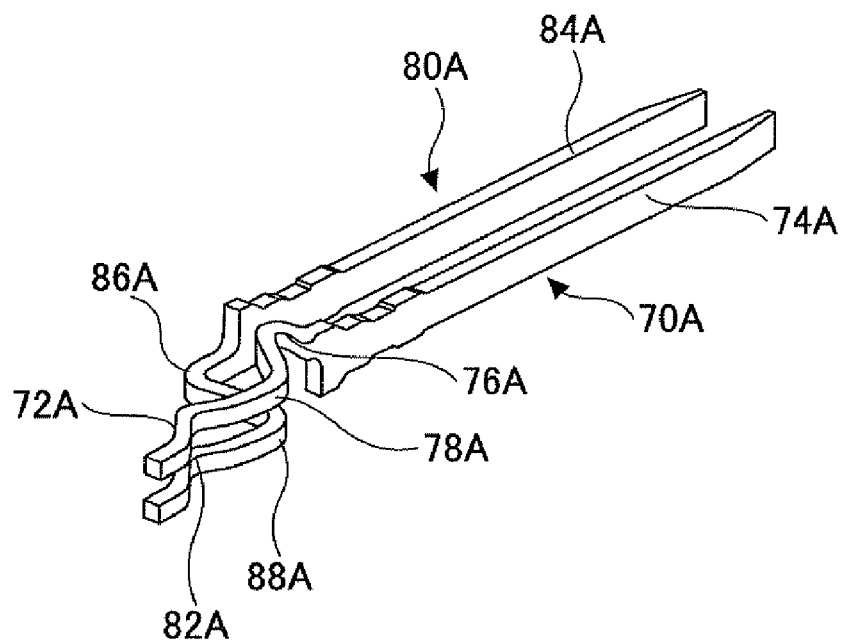
FIG. 16A is a perspective view illustrating where first and second contact members are attached to each other according to an embodiment of the present invention.
Figure 16B:
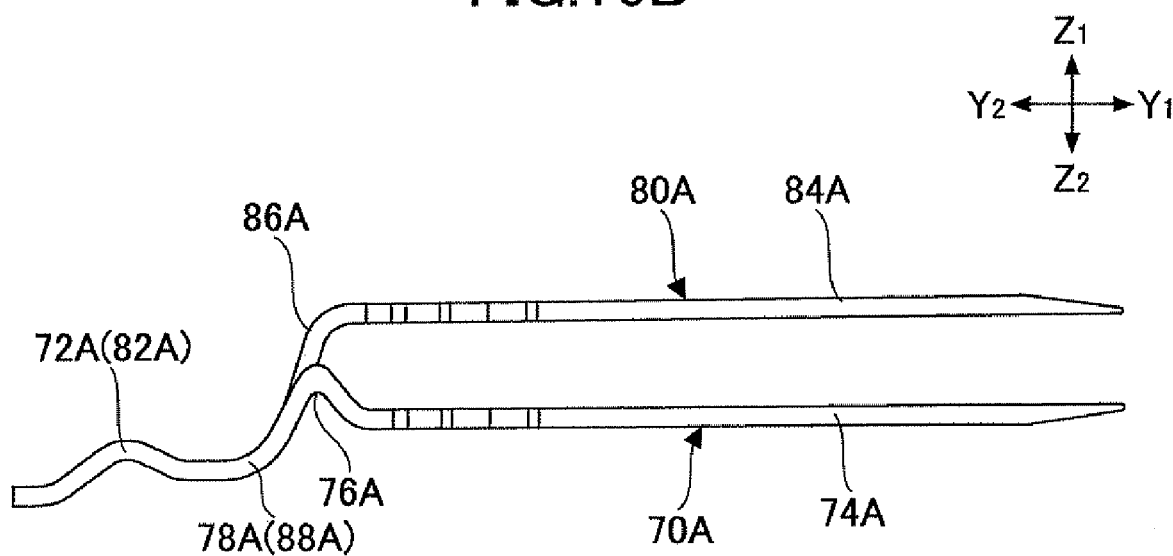
FIG. 16B is a side view illustrating where first and second contact members are attached to each other according to an embodiment of the present invention.
Figure 16C:
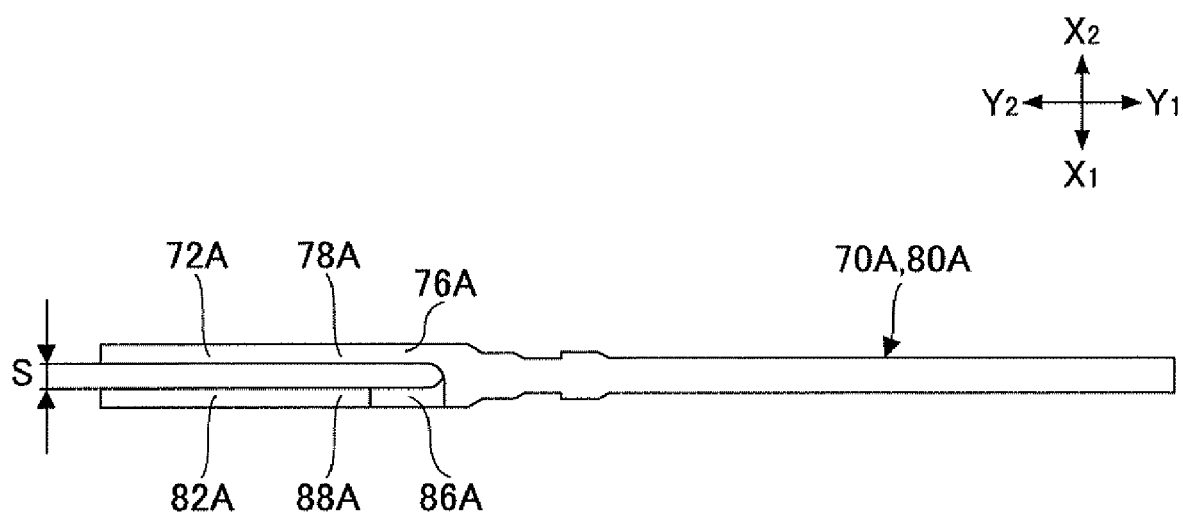
FIG. 16C is a plan view illustrating where first and second contact members are attached to each other according to an embodiment of the present invention.

FIG. 16A is a perspective view illustrating where the first and second contact members 70A and 80A are attached to each other according to an embodiment of the present invention. FIG. 16B is a side view illustrating where the first and second contact members 70A and 80A are attached to each other according to an embodiment of the present invention. FIG. 16C is a plan view illustrating where the first and second contact members 70A and 80A are attached to each other according to an embodiment of the present invention.

As illustrated in FIGS. 16A-16C and FIG. 12A, the contact parts 74A, 84A of the first and second contact members 70A, 80A are arranged on the front and back surfaces of the connecting part 22a and separated from each other having a space (distance in the Z1-Z2 directions) substantially equivalent to the thickness of the connecting part 22a provided in between. The lead parts 82A, 72A are arranged substantially in parallel in the X1-X2 directions and formed extending in the Y1-Y2 directions for contacting the input signal contact connecting pads 41a-48a formed on the front surface 30a of the relay wiring substrate 30.

Further, the contact parts 74A, 84A, which extend in the Y1-Y2 directions, are formed having substantially equal length. Further, in the first and second contact members 70A, 80A, a portion between the distal end toward the Y1 direction and the respective first bent parts 76A, 86A is symmetrically formed with respect to the Y1-Y2 direction (see, for example, FIG. 16C). Regarding the portion extending beyond the first bent parts 76A, 86A in the Y2 direction, the first and second contact members 70A, 80A are formed with substantially the same shape so that the second bent parts 78A, 88A and the lead parts 72A, 82A overlap each other. Thus, the entire lengths of the first and second contact members 70A, 80A are substantially equal. Accordingly, the first and second contact members 70A, 80A have substantially the same impedance.

Further, because each of the lead parts 72A, 82A is offset in the X2, X1 directions, the lead parts 72A, 82A extend substantially in parallel in the Y1-Y2 directions having a space S provided between them. The space S has a width corresponding to the intervals between the input signal contact connecting pads 41a-48a.

The first and second contact members 70A, 80A illustrated in FIG. 12A are input signal contact members. The third and fourth contact members 70B, 80B illustrated in FIG. 12B are output signal contact members. The third and fourth contact members 70B, 80B are members obtained by having the first and second contact members 70A, 80A inverted with respect to the vertical direction (Z1-Z2 direction). That is, the first and third contact members 70A, 70B are the same components, and the second and fourth contact members 80A, 80B are the same components.

Therefore, the first and second contact members 70A, 80A do not have to be fabricated separately from the third and fourth contact members 70B, 80B and may instead be fabricated together. Thereby, the cost for fabricating the first-fourth contact members 70A, 70B, 80A, and 80B can be reduced.

Accordingly, in each of the contact members 70A, 70B, 80A, and 80B, the contact parts 74A, 74B, 84A, and 84B are arranged on the front and back surfaces of the connecting part 22a in correspondence with the contact pairs (1)-(8) of the connecting part 22a and the lead parts 72A, 72B, 82A, and 82B are separately arranged on the input signal side and the output signal side in correspondence with the input signal contact connecting pads 41a-48a on the front surface 30a or in correspondence with the output signal contact connecting pads 41b-48b on the back surface 30b. Therefore, the ground layers 31, 32 provided inside the relay wiring substrate 30 can shield the areas between the lead parts 72A, 82A of the input signal contact pairs (5)-(8) and the lead parts 72B, 82B of the output signal contact pairs (1)-(4) and the areas between the input signal contact connecting pads 41a-48a and the output signal contact connecting pads 41b-48b, to thereby prevent crosstalk from being generated.

[Configuration of Cable Connector for Balanced Transmission Using the Above-Described Balanced Transmission Connector 10]

Figure 17:
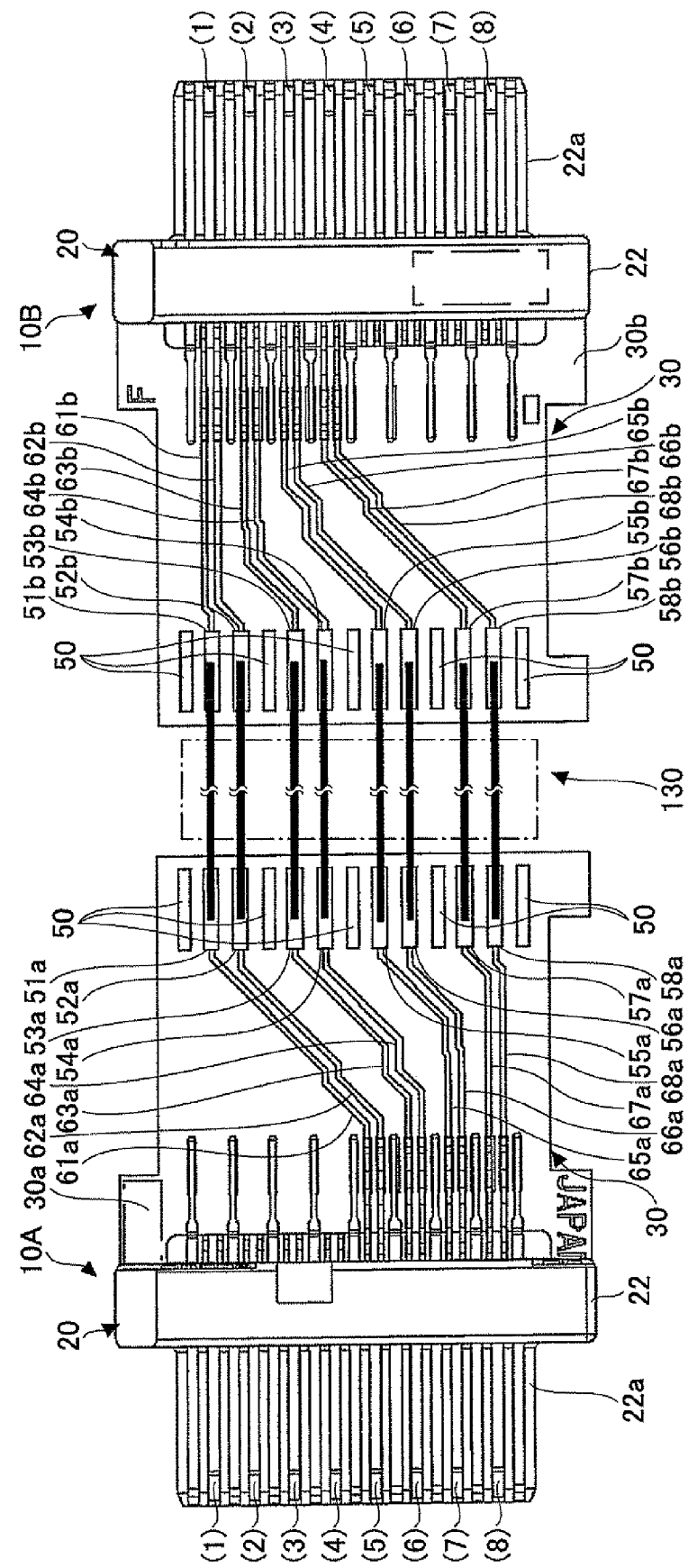
FIG. 17 is a plan view illustrating a cable connector for balanced transmission according to an embodiment of the present invention.

FIG. 17 is a plan view illustrating a balanced transmission cable connector 100 according to an embodiment of the present invention. As illustrated in FIG. 17, the balanced transmission cable connector 100 includes, for example, balanced transmission cables 130 having electric wire pairs 141-148, a first balanced transmission connector 10A having connector pairs (1)-(8) connected to one end of corresponding electric wire pairs 141-148, and a second balanced transmission connector 10B having connector pairs (1)-(8) connected to the other end of corresponding electric wire pairs 141-148.

The first and second balanced transmission connectors 10A, 10B have substantially the same configuration as the above-described balanced transmission connector 10 and are connected to the balanced transmission cable 130 in a manner inverted 180 degrees with respect to the Y1-Y2 directions.

[Combination of Wiring Patterns of Input Signal Transmission Paths of the Contact Pairs (5)-(8) Formed on the Front Surface Side]

In the input signal transmission paths of the contact pairs (5)-(8) on the front surface side illustrated in FIG. 17, the wiring patterns 61a, 62a formed on the first balanced transmission connector 10A having an entire length of L1a are connected to wiring patterns 61b, 62b formed on the second balanced transmission connector 10B having an entire length of L4b. Further, the wiring patterns 63a, 64a formed on the first balanced transmission connector 10A having an entire length of L2a are connected to wiring patterns 63b, 64b formed on the second balanced transmission connector 10B having an entire length of L3b. Further, the wiring patterns 65a, 66b formed on the first balanced transmission connector 10A having an entire length of L3a are connected to wiring patterns 65b, 66b formed on the second balanced transmission connector 10B having an entire length of L2b. Further, the wiring patterns 67a, 68a formed on the first balanced transmission connector 10A having an entire length of L4a are connected to wiring patterns 67b, 68b formed on the second balanced transmission connector 10B having an entire length of L1b.

Therefore, in the balanced transmission cable connector 100, the input signal transmission paths of each contact pair (5)-(8) are combined so that all of the combinations of the wiring patterns 61a-68a, 61b-68b of the first and second balanced transmission connectors 10A, 10B have substantially equal length. Thereby, the impedances of the input signal transmission paths of the contact pairs (5)-(8) become equal.

[Combination of Wiring Patterns of Output Signal Transmission Paths of the Contact Pairs (1)-(4) Formed on the Back Surface Side]

Although not illustrated in FIG. 17, in the output signal transmission paths of the contact pairs (1)-(4) on the back surface side, the wiring patterns 61b, 62b formed on the first balanced transmission connector 10A having an entire length of L4b are connected to wiring patterns 61a, 62a formed on the second balanced transmission connector 10B having an entire length of L1a. Further, the wiring patterns 63b, 64b formed on the first balanced transmission connector 10A having an entire length of L3b are connected to wiring patterns 63a, 64a formed on the second balanced transmission connector 10B having an entire length of L2a. Further, the wiring patterns 65b, 66b formed on the first balanced transmission connector 10A having an entire length of L3a are connected to wiring patterns 65a, 66a formed on the second balanced transmission connector 10B having an entire length of L3a. Further, the wiring patterns 67b, 68b formed on the first balanced transmission connector 10A having an entire length of L1b are connected to wiring patterns 67a, 68a formed on the second balanced transmission connector 10B having an entire length of L4a.

Therefore, in the balanced transmission cable connector 100, the output signal transmission paths of each contact pair (1)-(4) are combined so that all of the combinations of the wiring patterns 61b-68b of the first and second balanced transmission connectors 10A, 10B have substantially equal length. Thereby, the impedances of the output signal transmission paths of the contact pairs (1)-(4) become equal.

Accordingly, even in a case where the entire lengths L1a-L4a and L1b-L4b of the input signal wiring patterns 61a-68a and the output signal wiring patterns 61b-68b are different from each other, the total length of the wiring patterns corresponding to the contact pairs (1)-(8) become substantially equal by the combinations of the input signal wiring patterns 61a-68a and the output signal wiring patterns 61b-68b of the first and second balanced transmission connectors 10A, 10B connected to both ends of the balanced transmission cable 130. Therefore, an inconsistency of impedance characteristics of the balanced transmission cable connector 100 can be prevented.

Although the above-described embodiment describes the input signal transmission paths being provided on the front surface 30a of the relay wiring substrate 30 and the output signal transmission paths being provided on the back surface 30b of the relay wiring substrate 30, the output signal transmission paths may be provided on the front surface 30a of the relay wiring substrate 30 and the input signal transmission paths may be provided on the back surface 30b of the relay wiring substrate 30.

Although the above-described embodiment describes an example of eight connector pairs (four pairs on the input signal side and four pairs on the output signal side), more pairs of connectors may be provided.

With the above-described embodiment of the present invention, because each lead part of the input signal contact pairs is connected to the input signal contact connecting pads formed on the front surface or the back surface of the relay wiring substrate and each lead part of the output signal contact pairs is connected to the output signal contact connecting pads formed on the front surface or the back surface of the relay wiring substrate, the areas between the lead parts of the input signal contact pairs and the lead parts of the output signal contact pairs and the areas between the input signal contact connecting pads and the output signal contact connecting pads can be shielded by the ground layer provided inside the relay wiring substrate. Thereby, crosstalk can be positively prevented from being generated.

Further, the present invention is not limited to these embodiments, but variations and modifications may be made without departing from the scope of the present invention.

The present application is based on Japanese Priority Application No. 2008-123807 filed on May 9, 2008, with the Japanese Patent Office, the entire contents of which are hereby incorporated by reference.

What is claimed is:

1. A connector for balanced transmission comprising:
    a block member having a plurality of input contact pairs and output contact pairs formed on a front surface and a back surface thereof; and
    a relay wiring substrate having a front surface and a back surface on which a plurality of input contact connecting pads, output contact connecting pads, input wiring patterns, and output wiring patterns are formed, and having a ground layer interposed between the front surface and the back surface thereof;
    wherein each input contact pair includes first and second contact members,
    wherein the first contact member includes a first contact part provided on one of the front and back surfaces of the block member, and the second contact member includes a second contact part provided on the other of the front and back surfaces of the block member,
    wherein the first contact member further includes a first lead part, and the second contact member further includes a second lead part, both of the first and second lead parts being located on one of the front or the back surface of the relay wiring substrate, and
    wherein the first and second lead parts are configured to be connected to the input contact connecting pads formed on one of the front or the back surface of the relay wiring substrate, and
    wherein each output contact pair includes third and fourth contact members,
    wherein the third contact member includes a third contact part provided on one of the front and back surfaces of the block member, and the fourth contact member includes a fourth contact part provided on the other of the front and back surfaces of the block member, and
    wherein the third contact member further includes a third lead part, and the fourth contact member further includes a fourth lead part, both of the third and fourth lead parts being located on one of the front or the back surface of the relay wiring substrate, and
    wherein the third and fourth lead parts are configured to be connected to the output contact connecting pads formed on one of the front or the back surface of the relay wiring substrate opposite to the first and second lead parts.

2. The connector as claimed in claim 1, wherein the first and second contact parts have substantially equal lengths.

3. The connector as claimed in claim 2, wherein the third and fourth contact parts have substantially equal lengths.

4. The connector as claimed in claim 3, wherein the first, second, third, and fourth contact parts have substantially equal lengths.

5. The connector as claimed in claim 1, wherein the input wiring patterns, and output wiring patterns have the same pattern.

6. The connector as claimed in claim 3, wherein the first contact part and the third contact part are symmetric to each other, and wherein the second contact part and the fourth contact part are symmetric to each other.

7. The connector as claimed in claim 1, wherein the first and second lead parts are arranged to be parallel to each other, and wherein the third and fourth lead parts are arranged to be parallel to each other.

8. A cable connector for balanced transmission comprising:
    a balanced transmission cable including plural pairs of electric wires; and
    first and second connectors connected one to each end of the plural pairs of electric wires;
    wherein each of the first and second connectors has
    a block member having a plurality of input contact pairs and output contact pairs fanned on a front surface and a back surface thereof, and
    a relay wiring substrate having a front surface and a back surface on which a plurality of input contact connecting pads, output contact connecting pads, input wiring patterns, and output wiring patterns are formed, and having a ground layer interposed between the front surface and the back surface thereof,
    wherein each input contact pair includes first and second contact members,
    wherein the first contact member includes a first contact part provided on one of the front and back surfaces of the block member, and the second contact member includes a second contact part provided on the other of the front and back surfaces of the block member,
    wherein the first contact member further includes a first lead part, and the second contact member further includes a second lead part, both of the first and second lead parts being located on one of the front or the back surface of the relay wiring substrate, and
    wherein the first and second lead parts are configured to be connected to the input contact connecting pads formed on one of the front or the back surface of the relay wiring substrate, and
    wherein each output contact pair includes third and fourth contact members,
    wherein the third contact member includes a third contact part provided on one of the front and back surfaces of the block member, and the fourth contact member includes a fourth contact part provided on the other of the front and back surfaces of the block member, and
    wherein the third contact member further includes a third lead part, and the fourth contact member further includes a fourth lead part, both of the third and fourth lead parts being located on one of the front or the back surface of the relay wiring substrate, and
    wherein the third and fourth lead parts are configured to be connected to the output contact connecting pads formed on one of the front or the back surface of the relay wiring substrate opposite to the first and second lead parts.

9. The connector as claimed in claim 8, wherein the first and second lead parts are arranged to be parallel to each other, and wherein the third and fourth lead parts are arranged to be parallel to each other.

* * * * *